(12) United States Patent
Cho

(10) Patent No.: US 11,264,086 B2
(45) Date of Patent: Mar. 1, 2022

(54) MEMORY CONTROLLER AND OPERATING METHOD THEREOF

(71) Applicant: SK hynix Inc., Gyeonggi-do (KR)

(72) Inventor: Sung Yeob Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 16/841,030

(22) Filed: Apr. 6, 2020

(65) Prior Publication Data

US 2021/0065780 A1 Mar. 4, 2021

(30) Foreign Application Priority Data

Sep. 2, 2019 (KR) .................. 10-2019-0108259

(51) Int. Cl.
| | | |
|---|---|---|
| *G11C 7/00* | (2006.01) | |
| *G11C 11/4099* | (2006.01) | |
| *G11C 11/4096* | (2006.01) | |
| *G06F 13/16* | (2006.01) | |
| *G11C 11/4076* | (2006.01) | |
| *G11C 11/4093* | (2006.01) | |

(52) U.S. Cl.
CPC ...... *G11C 11/4099* (2013.01); *G06F 13/1621* (2013.01); *G11C 11/4076* (2013.01); *G11C 11/4093* (2013.01); *G11C 11/4096* (2013.01)

(58) Field of Classification Search
CPC ............ G11C 11/4099; G11C 13/1621; G11C 11/4076; G11C 11/4093; G11C 11/4096
USPC .................................................. 365/189.011
See application file for complete search history.

(56) References Cited

U.S. PATENT DOCUMENTS

| | | |
|---|---|---|
| 6,233,250 B1 | 5/2001 | Liu et al. |
| 6,466,736 B1 | 10/2002 | Chen et al. |
| 6,529,571 B1 | 3/2003 | Gaudet |

(Continued)

FOREIGN PATENT DOCUMENTS

| | | |
|---|---|---|
| KR | 10-0875348 | 12/2008 |
| KR | 10-0940611 | 2/2010 |

(Continued)

OTHER PUBLICATIONS

Office Action issued by the USPTO for U.S. Appl. No. 16/730,826 dated Dec. 24, 2020.

(Continued)

*Primary Examiner* — Viet Q Nguyen
(74) *Attorney, Agent, or Firm* — IP & T Group LLP

(57) ABSTRACT

A memory controller capable of sequentially increasing or decreasing a total current consumed by a plurality of memory devices, controls a plurality of memory devices coupled through a plurality of channels. The memory controller includes a request checker for identifying memory devices corresponding to requests received from a host among the plurality of memory devices, and generating the identified device information on memory devices to perform operations corresponding to the requests; a dummy manager for outputting a request for controlling a dummy pulse to be applied to channels of selected memory devices according to the device information among the plurality of channels; and a dummy pulse generator for sequentially applying the dummy pulse to the channels coupled to the selected memory devices, based on the request for controlling the dummy pulse.

20 Claims, 18 Drawing Sheets

(56) References Cited

U.S. PATENT DOCUMENTS

| | | |
|---|---|---|
| 6,587,918 B1 | 7/2003 | Christenson |
| 7,054,195 B2 * | 5/2006 | Matsunaga ............... 365/185.11 |
| 7,315,957 B1 | 1/2008 | Wagner et al. |
| 7,464,282 B1 | 12/2008 | Abdollahi-Alibeik et al. |
| 7,827,424 B2 | 11/2010 | Bounitch |
| 9,142,001 B2 | 9/2015 | Samson et al. |
| 9,405,350 B2 | 8/2016 | Kanai et al. |
| 9,424,901 B1 * | 8/2016 | An ........................... G11C 8/12 |
| 9,633,737 B2 * | 4/2017 | An ........................... G11C 16/14 |
| 10,042,416 B2 | 8/2018 | Tzafrir et al. |
| 10,249,234 B2 | 4/2019 | Kim |
| 10,409,357 B1 | 9/2019 | Li et al. |
| 10,825,535 B1 | 11/2020 | Pawlowski |
| 11,056,176 B2 * | 7/2021 | Shin .................... G11C 11/4085 |
| 2005/0201192 A1 | 9/2005 | Honda |
| 2007/0217356 A1 | 9/2007 | Kanno et al. |
| 2009/0002868 A1 | 1/2009 | Mallary et al. |
| 2009/0244756 A1 | 10/2009 | Itakura et al. |
| 2009/0285061 A1 | 11/2009 | Nagai |
| 2014/0023169 A1 | 1/2014 | Valiani et al. |
| 2016/0062930 A1 | 3/2016 | Kijima et al. |
| 2017/0062065 A1 | 3/2017 | Shim et al. |
| 2017/0351316 A1 | 12/2017 | Vratonjic et al. |
| 2018/0165023 A1 | 6/2018 | Oh et al. |
| 2019/0050159 A1 | 2/2019 | Jung et al. |
| 2019/0354300 A1 | 11/2019 | Benisty et al. |
| 2020/0159435 A1 | 5/2020 | Walker et al. |

FOREIGN PATENT DOCUMENTS

| | | |
|---|---|---|
| KR | 10-2011-0004165 | 1/2011 |
| KR | 10-1620348 | 5/2016 |
| KR | 10-2018-0138351 A | 12/2018 |
| KR | 10-1983463 | 5/2019 |

OTHER PUBLICATIONS

Office Action issued by the USPTO for U.S. Appl. No. 16/888,444 dated Oct. 14, 2021.

Office Action issued by the USPTO for U.S. Appl. No. 16/868,116 dated Oct. 27, 2021.

Office Action issued by the USPTO for U.S. Appl. No. 16/888,492 dated Dec. 3, 2021.

* cited by examiner

FIG. 12

|   | CMD_QUEUE1 | CMD_QUEUE2 | CMD_QUEUE3 | CMD_QUEUE4 |
|---|---|---|---|---|
| 1 | CMD1 | CMD6 | CMD8 | CMD12 |
| 2 | CMD2 | CMD7 | CMD9 | CMD13 |
| 3 | CMD3 | - | - | CMD14 |
| 4 | - | - | CMD10 | - |
| 5 | CMD4 | - | CMD11 | - |
| 6 | CMD5 | - | - | - |

MEMORY CONTROLLER AND OPERATING METHOD THEREOF

CROSS-REFERENCE TO RELATED APPLICATION

The present application claims priority under 35 U.S.C. § 119(a) to Korean patent application number 10-2019-0108259, filed on Sep. 2, 2019, which is incorporated herein by reference in its entirety.

BACKGROUND

Field of Invention

The present disclosure generally relates to an electronic device, and more particularly, to a memory controller and an operating method thereof.

Description of Related Art

A storage device stores data under the control of a host device such as a computer, a smart phone or a smart pad. The storage device may be a type that stores data on a magnetic disk, such as a Hard Disk Drive (HDD), or of a type that stores data on a semiconductor memory, i.e., a nonvolatile memory, such as a Solid State Drive (SSD) or a memory card.

The storage device may include a memory device that stores data and a memory controller that controls the memory device. The memory device may be a volatile memory device or a nonvolatile memory device. The nonvolatile memory device may be any of a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), and/or a Ferroelectric RAM (FRAM).

SUMMARY

Embodiments provide a memory controller capable of sequentially increasing or decreasing a total current consumed by a plurality of memory devices, and an operating method of the memory controller.

In accordance with an aspect of the present disclosure, there is provided a memory controller for controlling a plurality of memory devices coupled through a plurality of channels, the memory controller including: a request checker configured to identify memory devices corresponding to requests received from a host among the plurality of memory devices, and generate device information on the identified memory devices to perform operations corresponding to the requests, a dummy manager configured to output a request for controlling a dummy pulse to be applied to channels of selected memory devices according to the device information among the plurality of channels and a dummy pulse generator configured to sequentially apply the dummy pulse to the channels coupled to the selected memory devices based on the request for controlling the dummy pulse.

In accordance with another aspect of the present disclosure, there is provided a method for operating a memory controller for controlling a plurality of memory devices coupled through a plurality of channels, the method including: identifying memory devices corresponding to requests received from a host among the plurality of memory devices, generating device information for memory devices to perform operations corresponding to the requests, outputting a request for controlling a dummy pulse to be applied to channels of selected memory devices according to the device information among the plurality of channels and sequentially applying the dummy pulse to the channels coupled to the selected memory devices, based on the request for controlling the dummy pulse.

In accordance with still another aspect of the present disclosure, there is provided a memory controller for controlling a plurality of memory devices coupled through a plurality of channels, the memory controller including: a data transmitter configured to transmit data through channels corresponding to requests received from a host among the plurality of channels and a toggle transmitter configured to generate a dummy toggle in one or more channels other than the channels in which the data is transferred, wherein the dummy toggle is a pulse of a certain magnitude that is applied to memory devices coupled to the channels corresponding to the requests.

In accordance with still another aspect of the present disclosure, there is provided an operating method of a controller for controlling a plurality of memory devices through respective channels, the operating method comprising: selecting, based on requests, two or more of the memory devices and sequentially increasing, by sequentially applying a dummy pulse of a set duration to the selected memory devices, total current supplied to the selected memory devices to reach a peak when the selected memory devices start performing respectively requested operations at the same time.

In accordance with still another aspect of the present disclosure, there is provided an operating method of a controller for controlling a plurality of memory devices through respective channels, the operating method comprising: selecting, based on chip enable signals respectively corresponding to the memory devices, two or more among the memory devices and sequentially decreasing, by sequentially applying a dummy pulse of a set duration to the selected memory devices, total current supplied to the selected memory devices to reach a peak when the selected memory devices stop performing respectively requested operations at the same time.

In accordance with still another aspect of the present disclosure, there is provided an operating method of a controller for controlling a plurality of memory devices through respective channels, the operating method comprising: selecting, based on chip enable signals respectively corresponding to the memory devices, two or more of the memory devices and sequentially increasing, by sequentially applying a dummy pulse of a set duration to one or more first memory devices among the selected memory devices, total current supplied to the selected memory devices to reach a peak when the selected memory devices stop performing respectively requested operations at the same time, wherein the selected memory devices include the first memory devices and a single second memory device, wherein each of the first memory devices has one or more commands to be serviced, and wherein the single second memory device does not have any command to be serviced.

BRIEF DESCRIPTION OF THE DRAWINGS

Various embodiments are described more fully below with reference to the accompanying drawings; however, the present invention may be embodied in different forms and thus should not be construed as limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment," "another embodiment" or the like is not necessarily to only one embodiment, and different references to any such phrase are not necessarily to the same embodiment(s).

FIG. 12 is a diagram illustrating application or interruption of a dummy pulse, which is determined based on a command queue.

DETAILED DESCRIPTION

The specific structural and functional description disclosed herein is merely for the purpose of describing embodiments according to embodiments of the present disclosure. The present invention, however, may be implemented in various forms, and thus is not limited to the embodiments set forth herein.

Various embodiments of the present disclosure are described in detail below with reference to the accompanying drawings in order for those skilled in the art to be able to readily implement and practice the present invention.

Figure 1:
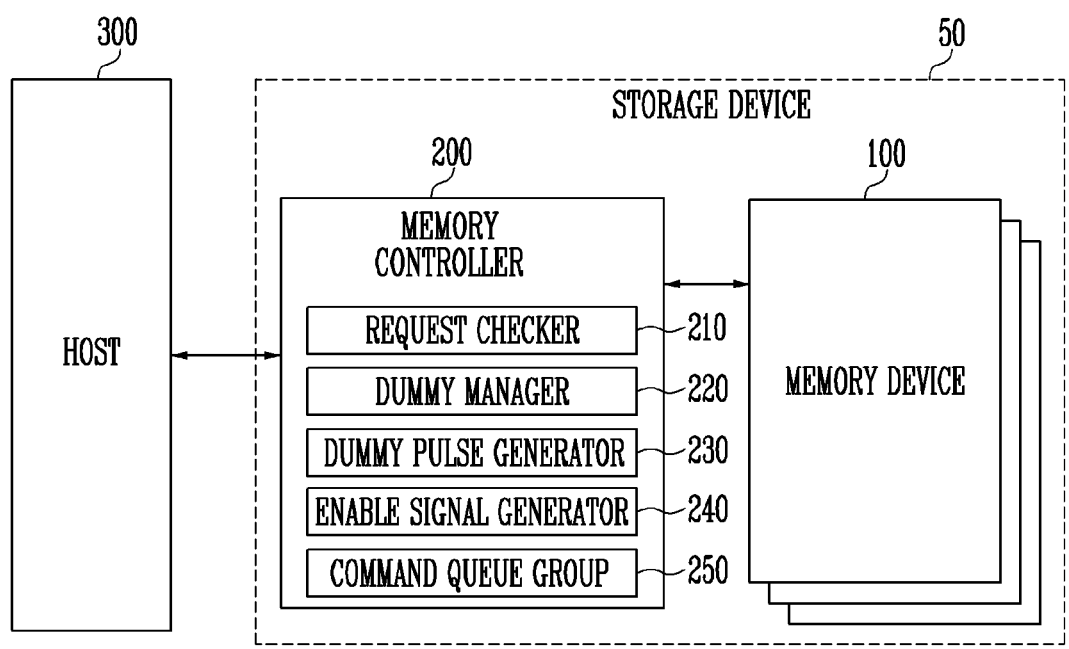
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be for storing data under the control of a host 300, such as a mobile phone, a smart phone, an MP3 player, a laptop computer, a desktop computer, a game console, a TV, a tablet PC or an in-vehicle infotainment.

The storage device 50 may be configured as any of various types of storage devices according to a host interface that is a communication scheme with the host 300. For example, the storage device 50 may be implemented as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and/or a memory stick.

The storage device 50 may be manufactured as any of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and/or a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells, which may constitute a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example, features and aspects of the present invention are described in the context in which the memory device 100 is a NAND flash memory.

In an embodiment, the memory device 100 may be implemented in a two-dimensional array structure or three-dimensional array structure. Below, an example in which the memory device 100 is implemented in the three-dimensional array structure is described as an embodiment; however, the present disclosure is not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single Level Cell (SLC) scheme in which one data bit is stored in one memory cell. Alternatively, the memory device 100 may be operated using a scheme in which at least two data bits are stored in one memory cell. For example, the memory device 100 may be operated using a Multi-Level Cell (MLC) scheme in which two data bits are stored in one memory cell, a Triple Level Cell (TLC) scheme in which three data bits are stored in one memory cell, or a Quadruple Level Cell (QLC) scheme in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, multiple instances of the memory device 100 may be provided. That is, a plurality of memory devices may be included in the storage device 50.

The plurality of memory devices may be coupled to, for communication with, the memory controller 200 through channels. For example, the memory controller 200 may instruct an operation of each of the plurality of memory devices, and each of the plurality of memory devices may perform an operation corresponding to the instruction of the memory controller 200. Also, each of the plurality of memory devices may output a result obtained by performing the operation to the memory controller 200.

The memory controller 200 may include a request checker 210. The request checker 210 may receive a request from the host 300, and may check which memory device among the plurality of memory devices the received request is directed to. The request checker 210 may generate device information by checking a memory device on which an operation corresponding to the request received from the host 300 is to be performed, based on the request. The device information may identify the memory device on which the operation is to be performed.

When operations are simultaneously performed or ended in memory devices, total current consumption of the storage device is rapidly increased or decreased, and hence noise may occur in a voltage source. Therefore, in order to prevent noise from occurring in the voltage source, operations to be performed on the memory devices may be delayed, or a dummy pulse may be applied to the memory devices, before the operations are performed on the memory devices.

Therefore, operations corresponding to requests received from the host 300 may be delayed and performed at a later time. That is, when the requests received from the host 300 allow operations to be simultaneously performed, the operations may be performed in a manner in which a next memory device performs an operation when another of the memory devices completes an operation.

However, when the operations corresponding to the requests received from the host 300 are delayed and performed later, a program time is lengthened, and therefore, program performance may be decreased. That is, latency corresponding to the delayed time may occur.

Accordingly, in an embodiment of the present disclosure, a method for applying a dummy pulse to a plurality of memory devices before operations are performed on the plurality of memory devices is provided.

In accordance with an embodiment of the present disclosure, the memory devices do not delay and perform operations, but simultaneously perform the operations after a dummy pulse is applied to memory devices on which the operations are to be performed, so that fast transmission of data and/or fast transfer of signals is possible.

In an embodiment, before operations are performed on memory devices identified in device information, a dummy pulse may be applied to a channel coupled to each of the corresponding memory devices. A dummy pulse is not simultaneously applied to a plurality of channels, but may be sequentially applied to each channel. That is, after the dummy pulse is applied to one channel of the plurality of channels, the dummy pulse may be applied to another channel whenever a set time elapses.

The memory controller 200 may include a dummy manager 220. The dummy manager 220 may output a request for applying or interrupting a dummy pulse.

Specifically, when it is determined that a plurality of memory devices simultaneously start operations, the dummy manager 220 may output a dummy pulse generation request, based on device information. That is, the dummy manager 220 may output a request for sequentially generating and applying a dummy pulse to channels to which memory devices included in the device information are coupled. For example, the dummy manager 220 may request the dummy pulse to be applied to a second channel after a certain time elapses from when the dummy pulse is applied to a first channel. Moreover, right after operations are performed, the dummy manager 220 may determine interrupting the applying a dummy pulse. Namely, since the memory devices start to operate, the dummy pulse no longer needs to be generated for increasing the total current consumption progressively.

Also, when it is determined that a plurality of memory devices simultaneously suspend or end operations, the dummy manager 220 may output a dummy pulse generation request or dummy pulse interruption request, based on a chip enable signal and a command queue level.

Specifically, at least one memory device of the plurality of memory devices may suspend an operation. Whether the memory device suspends the operation may be determined based on a high-state chip enable signal received from an enable signal generator 240. For example, the enable signal generator 240 may output a low-state chip enable signal to a selected memory device, and output high-state chip enable signal to memory devices in which operations are all ended or which are unselected memory devices.

The dummy manager 220 may receive a command queue level of a memory device corresponding to the high-state chip enable signal. The command queue level may be determined according to a number of commands queued in a command queue. When a command queue level is not 0, the dummy manager 220 may request the dummy pulse to be applied to a channel coupled to a memory device corresponding to the corresponding command queue level.

In order to prevent a plurality of memory devices from simultaneously suspending operations, the dummy manager 220 may apply the dummy pulse to channels coupled to the plurality of memory devices and then sequentially interrupt the applied dummy pulse. For example, when memory devices coupled to first to third channels suspend operations, the dummy manager 220 may request the dummy pulse to be applied to the first to third channels and then request the application of the dummy pulse to be sequentially suspended from the first channel.

The memory controller 200 may include a dummy pulse generator 230. The dummy pulse generator 230 may be a toggle transmitter that generates a dummy toggle and transmits the generated dummy toggle to a memory device. The dummy toggle may represent a set of dummy pulses to be applied to the channels. The toggle transmitter may generate the dummy toggle in one or more channels in addition to a channel for transmitting data. The toggle transmitter may generate the dummy toggle before data is transmitted.

The toggle transmitter may generate the dummy toggle, based on a warm-up enable signal generated on the basis of a request received from the host 300. The warm-up enable signal may identify a number of channels coupled to memory devices on which operations are to be performed in response to the request received from the host 300.

In an embodiment, the toggle transmitter may sequentially increase a current flowing through input/output pins coupled thereto, or sequentially apply the dummy toggle to the input/output pins to increase the number of input/output pins to which the dummy toggle is applied among the input/output pins.

In an embodiment, the dummy pulse generator 230 may generate or interrupt the dummy pulse by receiving the dummy pulse generation request or dummy pulse interruption request from the dummy manager 220.

For example, when the dummy pulse generator 230 receives the dummy pulse generation request, the dummy pulse generator 230 may generate the dummy pulse to be applied to a plurality of channels. Also, when the dummy pulse generator 230 receives the dummy pulse interruption request, the dummy pulse generator 230 may interrupt the dummy pulse applied to the plurality of channels by suspending the generation of the dummy pulse. The plurality of channels to which the dummy pulse is applied or from which the dummy pulse is interrupted may be channels except channels for transmitting data corresponding to requests received from the host.

In an embodiment, when a plurality of memory devices simultaneously start operations, the dummy pulse generator 230 may generate the dummy pulse to be sequentially applied to a plurality of channels. The dummy pulse generator 230 may adjust a degree to which a total current consumption of the plurality of memory devices is increased, by setting a period of the dummy pulse, a level of the dummy pulse, or a time for which the dummy pulse is applied.

In an embodiment, when a plurality of memory devices simultaneously end operations, the dummy pulse generator 230 may generate the dummy pulse to be applied to channels to which the memory devices ending the operations are coupled and then sequentially interrupt the dummy pulse. Similarly, the dummy pulse generator 230 may adjust a degree to which a total current consumption of the plurality of memory devices is decreased, by setting a period of the dummy pulse, a level of the dummy pulse, or a duration of the dummy pulse.

The memory controller 200 may include the enable signal generator 240. The enable signal generator 240 may generate signals for controlling a selected memory device 100 according to an address, and transmit the generated signals through control signal lines coupled to the selected memory device 100. The control signal lines may include a chip enable line CE #, a write enable line WE #, a read enable line RE #, an address latch enable line ALE, a command latch enable line CLE, a write prevention line WP #, and a ready/busy line RB.

For example, the enable signal generator 240 may generate a chip enable signal input through the chip enable line CE #, a read enable signal input through the write enable line WE #, an address latch enable signal input through the address latch enable line ALE, a command latch enable signal input through the command latch enable line CLE, and a write prevention signal input through the write prevention line WP #.

In an embodiment, the chip enable signal generated by the enable signal generator 240 may be a signal that enables communication between the memory controller 200 and the memory device 100. For example, when the chip enable signal is in a low state, the communication between the memory controller 200 and the memory device 100 is enabled. When the chip enable signal is in a high state, the communication between the memory controller 200 and the memory device 100 is disabled.

The enable signal generator 240 may generate the chip enable signal to be provided to the memory device 100 and the dummy manager 220. The memory device 100 may communicate with the memory controller 200 by receiving the chip enable signal, and the dummy manager 220 may determine whether the dummy pulse is applied to channels coupled to a plurality of memory devices, by receiving the chip enable signal.

The memory controller 200 may include a command queue group 250. The command queue group 250 may include command queues respectively corresponding to a plurality of memory devices.

For example, the number of command queues in the command queue group 250 may correspond to the number of the memory devices. Therefore, commands executed in each of the plurality of memory devices may be queued in the corresponding command queue. The command queue group 250 may output a number of commands queued in a command queue for a corresponding memory device in response to a request from the dummy manager 220. The number of commands queued in each command queue may be a command queue level. For example, when a number of commands queued in a command queue corresponding to one memory device is "0," the command queue level of the corresponding memory device may be "0." When a number of commands queued in a command queue corresponding to one memory device is "1," the command queue level of the corresponding memory device may be "1."

In an embodiment, a channel to which the dummy pulse is applied may be determined based on the command queue level. That is, although the memory device 100 temporarily ends an operation, when a memory device is to immediately perform another operation, the dummy pulse may be applied to a channel coupled to the corresponding memory device.

The memory controller 200 may include a data transmitter (not shown). The data transmitter may transmit data through channels corresponding to requests received from the host.

For example, when a request received from the host is a program request for a first memory device among a plurality of memory devices, the data transmitter may transmit data through a first channel coupled to the first memory device. The channel through which the data is transmitted may be different from the channel through which the dummy pulse is applied or interrupted.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may include firmware (not shown) capable of receiving data and a Logical Block Address (LBA) from the host 300, and translating the LBA into a Physical Block Address (PBA) representing addresses of memory cells included in the memory device 100, in which data is to be stored. Also, the memory controller 200 may store, in a buffer memory, a logical-physical address mapping table that establishes a mapping relationship between the LBA and the PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a PBA, and data. When a read request is received together with an LBA from the host 300, the memory controller 200 may change the read request into a read command, select a PBA corresponding to the LBA, and then provide the memory device 100 with the read command and the PBA. When an erase request is received together with an LBA from the host 300, the memory controller 200 may change the erase request into an erase command, select a PBA corresponding to the LBA, and then provide the memory device 100 with the erase command and the PBA.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory. Alternatively, the memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the buffer memory may be external to the storage device 50 and coupled thereto. Therefore, externally disposed volatile memory devices coupled to the storage device 50 may perform functions of the buffer memory.

In an embodiment, the memory controller 200 may control at least two memory devices. The memory controller 200 may control the memory devices according to an interleaving scheme to improve operational performance.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD) card, a Multi-Media Card (MMC), an embedded MMC (eMMC), a Dual In-line Memory Module (DIMM), a Registered DIMM (RDIMM), and/or a Load Reduced DIMM (LRDIMM).

Figure 2:
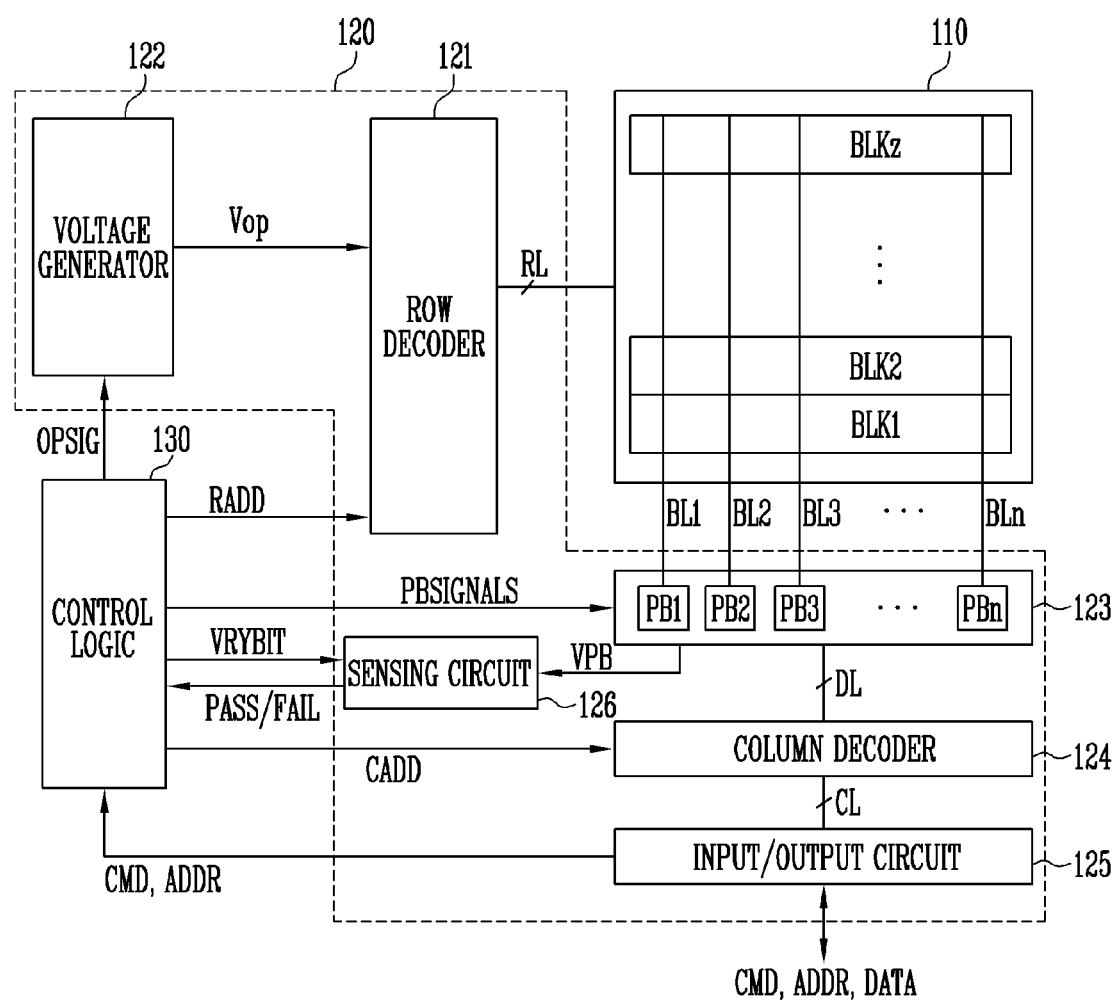
FIG. 2 is a diagram illustrating a structure of a memory device, such as that shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to a row decoder 121 through row lines RL. The plurality of memory blocks BLK1 to BLKz are coupled to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn, or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines coupled to the selected memory blocks.

The voltage generator 122 operates under the control of the control logic 130. The voltage generator 122 generates a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erase voltage, and the like under the control of the control logic 130.

In an embodiment, the voltage generator 122 may generate an internal power voltage by regulating the external power voltage. The internal power voltage generated by the voltage generator 122 is used as an operation voltage for the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are coupled to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing voltages or currents received from the selected memory cells through the first to nth bit lines BL1 to BLn.

In a read operation, the first to nth page buffers PB1 to PBn read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example, the column decoder 124 may communicate data with the first to nth page buffers PB1 to PBn through data lines EL, or communicate data with the input/output circuit 125 through column lines CL.

The input/output circuit 125 may transfer a command CMD and an address ADDR, which are received from the memory controller (200, to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation a selected sub-block included in the selected memory block in response to a sub-block erase command and an address. Also, the control logic 130 may determine whether the verify operation has passed or failed in response to the pass or fail signal PASS or FAIL.

Each of the memory cells included in the memory cell array 110 may be programmed to a program state among a plurality of program states according to data stored therein. A target program state of a memory cell may be determined as one of the plurality of program states according to data stored in the memory cell.

Figure 3:
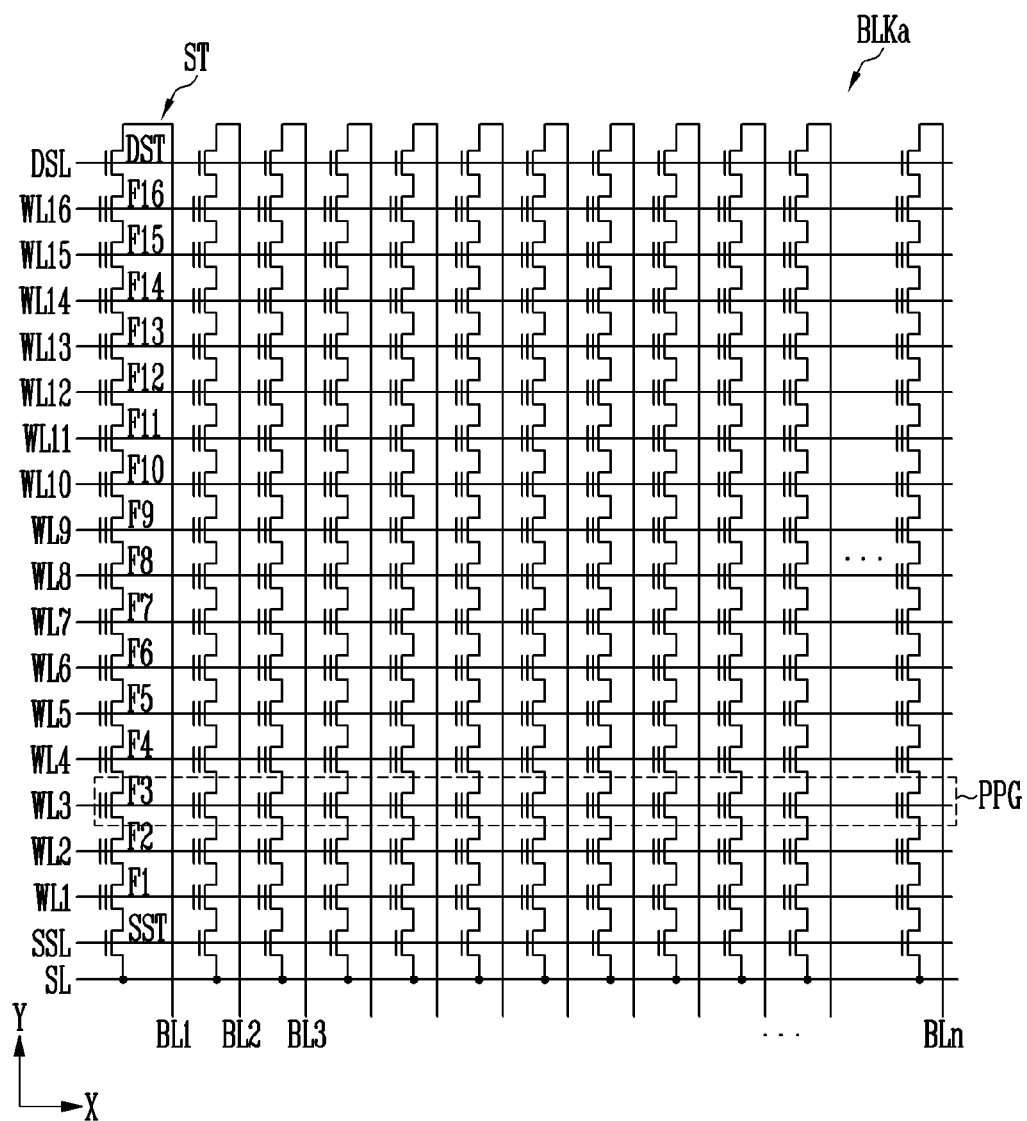
FIG. 3 is a diagram illustrating a memory block.

FIG. 3 is a diagram illustrating a memory block.

Referring to FIGS. 2 and 3, FIG. 3 is a circuit diagram illustrating a memory block BLKa among the plurality of memory blocks BLK1 to BLKz included in the memory cell array 110 shown in FIG. 2.

In the memory block BLKa, a first select line, word lines, and a second select line, which are arranged in parallel, may be coupled to each other. For example, the word lines may be arranged in parallel between the first and second select lines. The first select line may be a source select line SSL, and the second select line may be a drain select line DSL.

More specifically, the memory block BLKa may include a plurality of strings coupled between bit lines BL1 to BLn and a source line SL. The bit lines BL1 to BLn may be respectively coupled to the strings, and the source line SL may be commonly coupled to the strings. The strings may be configured identically to one another, and therefore, a string ST coupled to a first bit line BL1 is described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and more than 16 memory cells (F1 to F16) shown in the drawing may be included in one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings may be coupled in common to the source select line SSL, and gates of drain select transistors DST included in different strings may be coupled in common to the drain select line DSL. Gates of the memory cells F1 to F16 may be respectively coupled to a plurality of word lines WL1 to WL16.

A group of memory cells coupled to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include a number of data bits which number correspond to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is generally referred to as the MLC. As memory cells with higher storage capacity have been developed, the term MLC has taken on a more specific meaning, referring to a memory cell for storing data of two bits. In that case, a memory cell for storing data of three or more bits is referred to as a triple level cell (TLC), and a memory cell for storing data of four or more bits is referred to as a quadruple level cell (QLC). Embodiments of the present invention may be applied to memory systems with memory cells in which data of two or more bits are stored per cell.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 4:
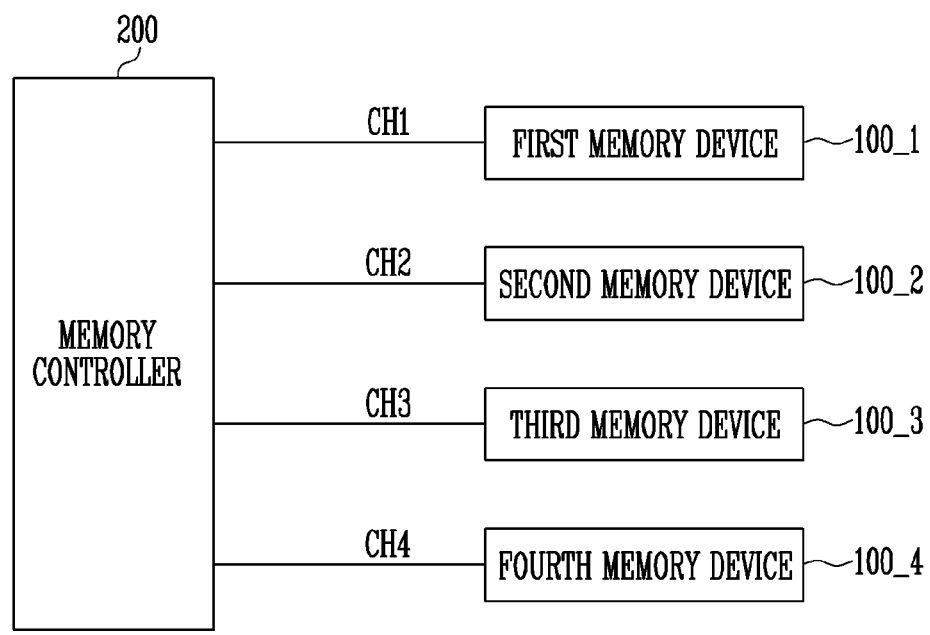
FIG. 4 is a diagram illustrating an embodiment of memory devices coupled to a plurality of channels.

FIG. 4 is a diagram illustrating an embodiment of a plurality of memory devices coupled to a memory controller via a plurality of channels, respectively.

Referring to FIG. 4, FIG. 4 illustrates a plurality of memory devices of the storage device 50 shown in FIG. 1, coupled to the memory controller 200. In FIG. 4, there are four, i.e., first to fourth memory devices 100_1 to 100_4, memory devices, although the present invention is not limited to that number. In plural memory device embodiments, the storage device 50 may include any suitable number of memory devices.

In the illustrated embodiment, the memory controller 200 may be coupled to the first memory device 100_1 through a first channel CH1, be coupled to the second memory device 100_2 through a second channel CH2, be coupled to the third memory device 100_3 through a third channel CH3, and be coupled to the fourth memory device 100_4 through a fourth channel CH4.

In an embodiment, each of the first to fourth channels CH1 to CH4 may include not only a channel for transmitting data received from the host 300 (shown in FIG. 1) but also a channel for applying or interrupting a dummy toggle.

The memory controller 200 may generate a command corresponding to a request received from the host 300 (shown in FIG. 1), and output the generated command to one of the first to fourth memory devices 100_1 to 100_4. The request received from the host 300 may be a program request, read request or erase request for one of the first to fourth memory devices 100_1 to 100_4.

For example, when the request received from the host 300 is a read request for the first memory device 100_1, the memory controller 200 may generate a command corresponding to the read request, and output the generated command to the first memory device 100_1 through the first channel CH1. The memory controller 200 may also output an address corresponding to the read request, in addition to the command corresponding to the read request, to the first memory device 100_1 through the first channel CH1.

When the request received from the host 300 is a program request for the second memory device 100_2, the memory controller 200 may generate a command corresponding to the program request, and output the generated command to the second memory device 100_2 through the second channel CH2. The memory controller 200 may also output an address and data, which correspond to the program request, to the second memory device 100_2 through the second channel CH2.

As described above, the memory controller 200 may generate a command, an address, and/or data, which correspond to a request received from the host 300. When the corresponding request is for the first memory device 100_1, the memory controller 200 may output the generated command, the generated address, and/or the generated data through the first channel CH1. When the corresponding request is for the second memory device 100_2, the memory controller 200 may output the generated command, the generated address, and/or the generated data through the second channel CH2. When the corresponding request is for the third memory device 100_3, the memory controller 200 may output the generated command, the generated address, and/or the generated data through the third channel CH3. When the corresponding request is for the fourth memory device 100_4, the memory controller 200 may output the generated command, the generated address, and/or the generated data through the fourth channel CH4.

Consequently, the memory controller 200 may communicate with a plurality of memory devices through a plurality of channels.

In an embodiment, when each of the plurality of memory devices performs an operation corresponding to a command received through a channel, current may be consumed. In particular, when the plurality of memory devices simultaneously start or end operations, a total current consumption of the plurality of memory devices may be rapidly increased or decreased. When the total current consumption is rapidly increased or decreased, noise occurs in a voltage source, therefore, the reliability of an operation may be deteriorated.

Accordingly, embodiments of the present disclosure provide a method for sequentially applying a dummy pulse to the channels, when the first to fourth memory devices 100_1 to 100_4 simultaneously start operations. Also, embodiments of the present disclosure provide a method for applying a dummy pulse to the channels and then sequentially interrupting the dummy pulse, when the first to fourth memory devices 100_1 to 100_4 simultaneously end operations.

Figure 5:
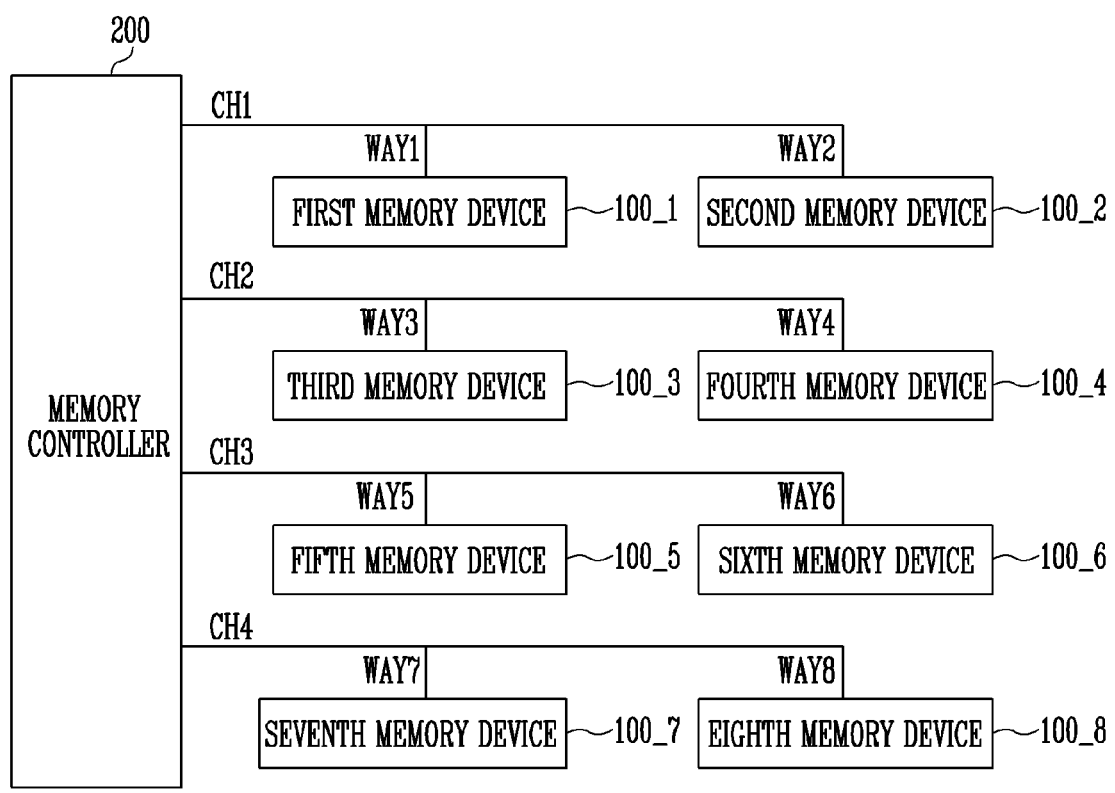
FIG. 5 is a diagram illustrating another embodiment of the memory devices coupled to the plurality of channels.

FIG. 5 is a diagram illustrating another embodiment of the memory devices coupled to the plurality of channels.

Like the arrangement shown in FIG. 4, in FIG. 5 multiple memory devices (first to eighth memory devices 100_1 to 100_8 in this case) may be coupled to the memory controller 200 through multiple channels. However, while FIG. 4 illustrates a structure in which one memory device is coupled to one channel, FIG. 5 illustrates a structure in which two memory devices are coupled to one channel. In another embodiment, three or more memory devices may be coupled to one channel.

In an embodiment, the first memory device 100_1 and the second memory device 100_2 are coupled to the first channel CH1 through a first way WAY 1 and a second way WAY2, respectively. In addition, the third memory device 100_3 and the fourth memory device 100_4 are coupled to the second channel CH2 through a third way WAY 3 and a fourth way WAY4, respectively.

In an embodiment, the fifth memory device 100_5 and the sixth memory device 100_6 are coupled to the third channel CH3 through a fifth way WAY 5 and a sixth way WAY6, respectively. In addition, the seventh memory device 100_7 and the eighth memory device 100_8 are coupled to the fourth channel CH4 through a seventh way WAY 7 and an eighth way WAY8, respectively.

In an embodiment, each of the first to fourth channels CH1 to CH4 may include not only a channel for transmitting data received from the host 300 but also a channel for applying or interrupting a dummy toggle.

In an embodiment, the memory controller 200 may generate a command corresponding to a request received from the host 300, and output the generated command to any one of the first to eighth memory devices 100_1 to 100_8. The request received from the host 300 may be a program request, read request or erase request for any one of the first to eighth memory devices 100_1 to 100_8.

For example, when the request received from the host 300 is a read request for the first memory device 100_1, the memory controller 200 may generate a command corresponding to the read request, and output the generated command to the first memory device 100_1 through the first channel CH1. The memory controller 200 may also output an address corresponding to the read request, in addition to the command corresponding to the read request, to the first memory device 100_1 through the first channel CH1.

When the request received from the host 300 is a program request for the second memory device 100_2, the memory controller 200 may generate a command corresponding to the program request, and output the generated command to the second memory device 100_2 through the first channel CH1. The memory controller 200 may also output an address and data, which correspond to the program request, to the second memory device 100_2 through the first channel CH1.

As described above, when the request received from the host 300 is a request for the first memory device 100_1 or the second memory device 100_2, the memory controller 200 may output a command, an address, and/or data, which correspond to the request from the host 300, to the first memory device 100_1 or the second memory device 100_2 through the first channel CH1. In addition, when the request received from the host 300 is a request for the third memory device 100_3 or the fourth memory device 100_4, the memory controller 200 may output a command, an address, and/or data, which correspond to the request from the host 300, to the third memory device 100_3 or the fourth memory device 100_4 through the second channel CH2.

In an embodiment, when the request received from the host 300 is a request for the fifth memory device 100_5 or the sixth memory device 100_6, the memory controller 200 may output a command, an address, and/or data, which correspond to the request from the host 300, to the fifth memory device 100_5 or the sixth memory device 100_6 through the third channel CH3. In addition, when the request received from the host 300 is a request for the seventh memory device 100_7 or the eighth memory device 100_8, the memory controller 200 may output a command, an address, and/or data, which correspond to the request from the host 300, to the seventh memory device 100_7 or the eighth memory device 100_8 through the fourth channel CH4.

Consequently, as in the arrangement shown in FIG. 4, in the arrangement of FIG. 5, the memory controller 200 may communicate with a plurality of memory devices through a plurality of channels.

In an embodiment, when each of the plurality of memory devices performs an operation corresponding to a command received through a channel, current may be consumed. In particular, when the plurality of memory devices simultaneously start or end operations, a total current consumption of the plurality of memory devices may rapidly increase or decrease. When the total current consumption rapidly increases or decreases, noise occurs in a voltage source, therefore, the reliability of an operation may deteriorate.

According to embodiments of the present disclosure, in order to prevent rapid change of the total current consumption, the memory controller 200 may apply a dummy pulse to the channels before the plurality of memory devices start operations, or apply a dummy pulse to the channels when the memory devices end operations and then sequentially interrupt the dummy pulse.

Figure 6:
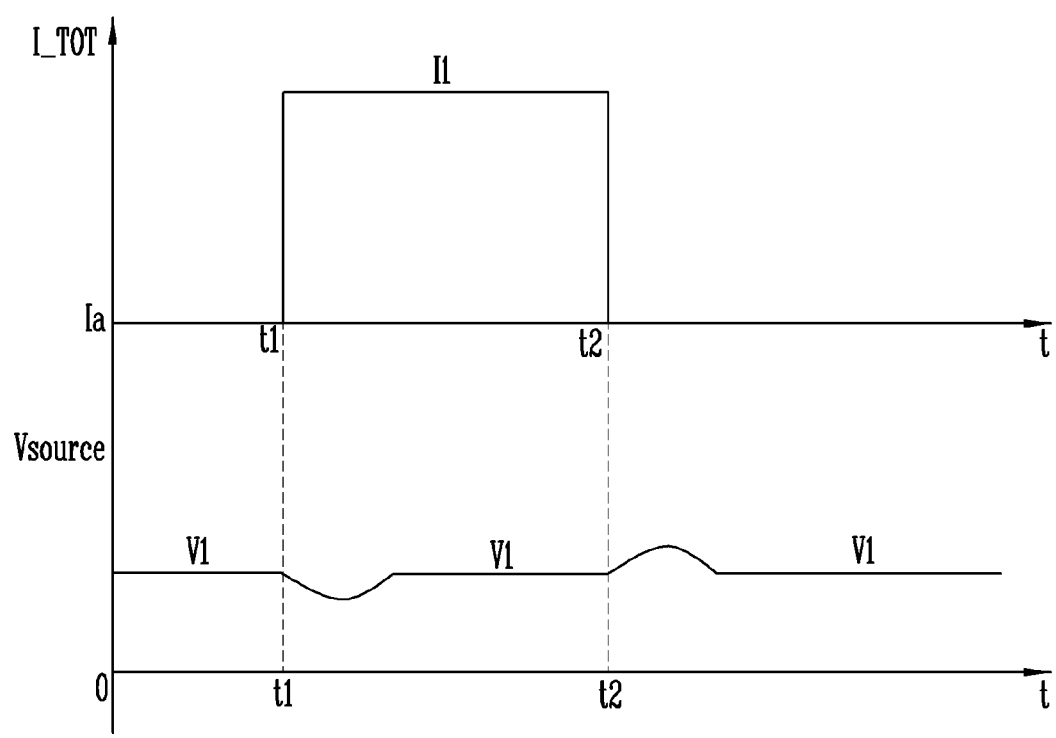
FIG. 6 is a diagram illustrating a change in total current consumption and noise of a voltage source, when memory devices coupled to a plurality of channels simultaneously start or end operations.

FIG. 6 is a diagram illustrating a change in total current consumption and noise of a voltage source, when memory devices coupled to a plurality of channels simultaneously start or end operations.

Referring to FIG. 6, the horizontal axis represents time t, and the vertical axis represents a total current consumption I_TOT of the plurality of memory devices and a voltage source Vsource applied to the plurality of memory devices. The voltage source Vsource applied to the plurality of memory devices is V1 in the present example.

In an embodiment, each of the plurality of memory devices coupled to the memory controller through the plurality of channels may perform an operation corresponding to a command received from the memory controller. The plurality of memory devices may perform operations simultaneously or at different times.

FIG. 6 illustrates a total current consumption I_TOT and a voltage source Vsource when the plurality of memory devices simultaneously perform operations.

Referring to FIG. 6, a voltage applied to the plurality of memory devices may be constantly maintained. However, when the plurality of memory devices simultaneously start or end operations, noise may occur in the voltage source.

For example, at t1, the plurality of memory devices may simultaneously start operations. Therefore, at t1, a total current consumption I_TOT of the plurality of memory devices may rapidly increase from Ia to I1. Noise occurs in the voltage source Vsource, and hence the voltage source may be decreased and then again become V1. The presence of noise in the voltage source Vsource may cause the plurality of memory devices to perform abnormally.

Subsequently, at t2, the plurality of memory devices may simultaneously end operations. Therefore, at t2, a total current consumption I_TOT of the plurality of memory devices may rapidly decrease from I1 to Ia. Noise occurs in the voltage source Vsource, and hence the voltage source Vsource may be increased and again become V1. Furthermore, the presence of noise in the voltage source Vsource may cause the plurality of memory devices to perform abnormally.

Consequently, when the plurality of memory devices simultaneously perform operations, the total current consumption I_TOT may rapidly change, and noise may occur in the voltage source Vsource. The noise in the voltage source Vsource may, in turn, cause the plurality of memory devices to perform abnormally; hence, it is necessary to prevent the total current consumption I_TOT from being rapidly changed.

Therefore, in order to prevent noise from occurring in the voltage source Vsource, operations to be performed on the plurality of memory devices may be delayed and performed later than they otherwise would be performed, or operations may be simultaneously performed after a dummy pulse is applied to memory devices on which the operations are to be performed among the plurality of memory devices.

When operations on which the plurality of memory devices are to be performed are delayed and performed later, the memory devices may be controlled to perform their operations serially. That is, after one memory device completes an operation, another memory device starts an operation, until all of the memory devices have completed their respective operations. However, according to this serial method, overall program time may be lengthened. As a result, program performance may be decreased. That is, latency corresponding to the delayed time may occur.

Accordingly, embodiments of the present disclosure provide a method for applying a dummy pulse to, or interrupting a dummy pulse in, channels coupled to the memory controller and the plurality of memory devices to prevent the total current consumption I_TOT from being rapidly changed.

In accordance with embodiments of the present disclosure, the memory devices do not delay and perform operations, but simultaneously perform the operations after a dummy pulse is applied to those memory devices, so that fast transmission of data or fast transfer of signals is possible.

Figure 7:
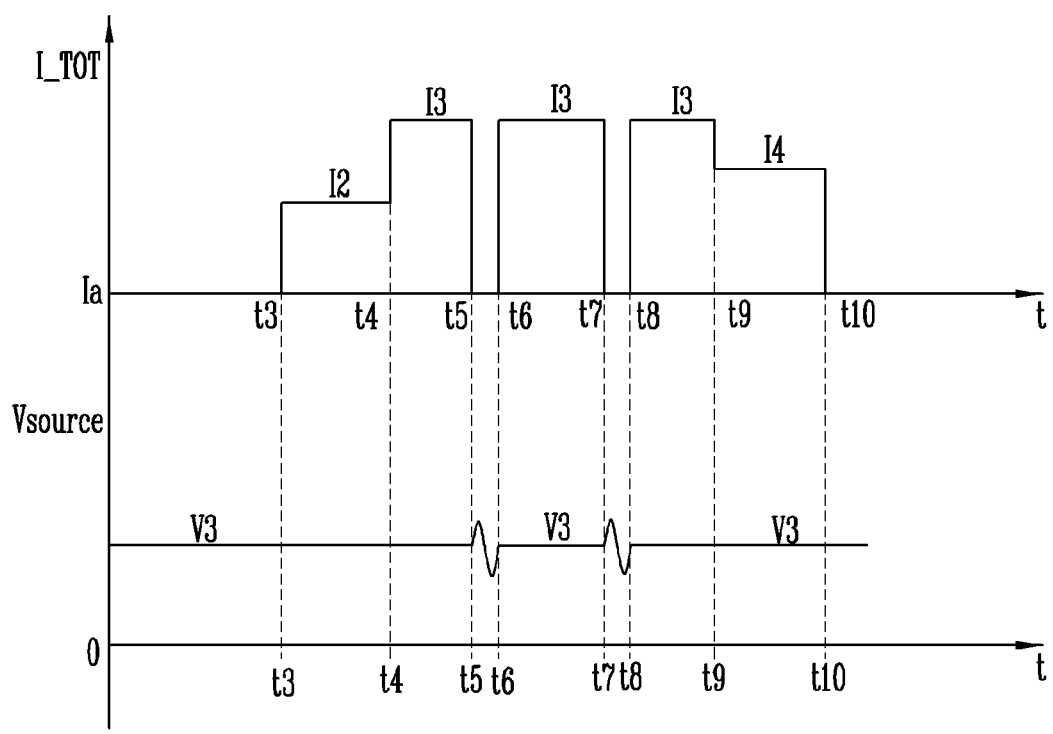
FIG. 7 is a diagram illustrating a change in total current consumption and noise of a voltage source, when a plurality of memory devices simultaneously end operations while performing the operations.

FIG. 7 is a diagram illustrating a change in total current consumption and noise of a voltage source, when a plurality of memory devices simultaneously end operations while performing the operations.

Referring to FIG. 7, the horizontal axis represents time t, and the vertical axis represents a total current consumption I_TOT of the plurality of memory devices and a voltage source Vsource applied to the plurality of memory devices. The voltage source Vsource applied to the plurality of memory devices is V3 in this example.

Referring to FIGS. 6 and 7, while FIG. 6 illustrates a total current consumption I_TOT and a voltage source Vsource when the plurality of memory devices simultaneously start or end operations, FIG. 7 illustrates a total current consumption I_TOT and a voltage source Vsource when the plurality of memory devices simultaneously suspend or end operations then start the operations again. Here, the plurality of memory device initially start the operations at different times.

In FIG. 7, a case where the memory controller is coupled to a first memory device through a first channel and is coupled to a second memory device through a second channel is shown.

In an embodiment, at t3, the first memory device may start an operation. Therefore, the total current consumption I_TOT may increase from Ia to I2. That is, the total current consumption I_TOT when the first memory device performs the operation may be I2. Since the total current consumption I_TOT does not rapidly increase, the voltage source Vsource may be maintained as V3.

Subsequently, at t4, the second memory device may start an operation. Therefore, the total current consumption I_TOT may increase from I2 to I3. When the first memory device starts the operation at t3, the total current consumption I_TOT increases to I2. However, because the additional increase of the total current consumption I_TOT to I3 at t4 when the second memory device starts an operation is not a rapid increase, the voltage source Vsource may be maintained as V3.

At t4 to t5, both the first and second memory devices are performing the operations. Therefore, the total current consumption I_TOT may be I3, and the voltage source Vsource may be V3.

Subsequently, at t5, both the first and second memory devices may end the operations. That is, the first and second memory devices may have an idle period or interval (t5 to t6) in which the first and second memory devices temporarily end (or suspend) the operations. Since the first and second memory devices simultaneously end the operations, the total current consumption I_TOT may rapidly decrease, and then rapidly increase again when the first and second memory devices simultaneously start (or resume) the operations.

Therefore, during the interval t5 to t6, noise may occur in the voltage source Vsource. That is, from t5 to t6, the voltage source Vsource may be increased, when the total current consumption I_TOT rapidly decreases. When the total current consumption I_TOT rapidly increases, the voltage source Vsource may decrease, then become V3 again.

Consequently, from t5 to t6, noise may occur in the voltage source, when the total current consumption I_TOT changes.

In an embodiment, both the first and second memory devices may end the operations and then start the operations again at t6, and continue performing the operations after t6 until t7. That is, the first and second memory devices may have another idle period from t7 to t8. As in the interval t5 to t6, in the interval t7 to t8, noise may occur in the voltage source Vsource, as a result of a rapid decrease followed by a rapid increase in the total current consumption I_TOT.

Subsequently, at t9, the first memory device may end the operation. Therefore, the total current consumption I_TOT may decrease from I3 to I4. That is, the total current consumption I_TOT when the second memory device alone performs the operation may be I4. Since the total current consumption I_TOT does not rapidly decrease, the voltage source Vsource may be maintained as V3.

At t10, the second memory device may also end the operation. Therefore, the total current consumption I_TOT may decrease from I4 to Ia. Similar to t9, since the total current consumption I_TOT does not rapidly decrease, the voltage source Vsource may be maintained as V3.

Consequently, when the total current consumption I_TOT is rapidly decreased or increased, noise may occur in the voltage source Vsource, which, in turn, may result in errors in the operations performed by the memory device(s) during that time. Therefore, it is necessary to ensure that the operations by the plurality of memory devices are performed reliably.

Accordingly, embodiments of the present disclosure provide a method for applying a dummy pulse through channels, or interrupting a dummy pulse so applied, to prevent noise from occurring in the voltage source Vsource. Below, an operation of preventing or minimizing the occurrence of noise in the voltage source Vsource is described.

Figure 8:
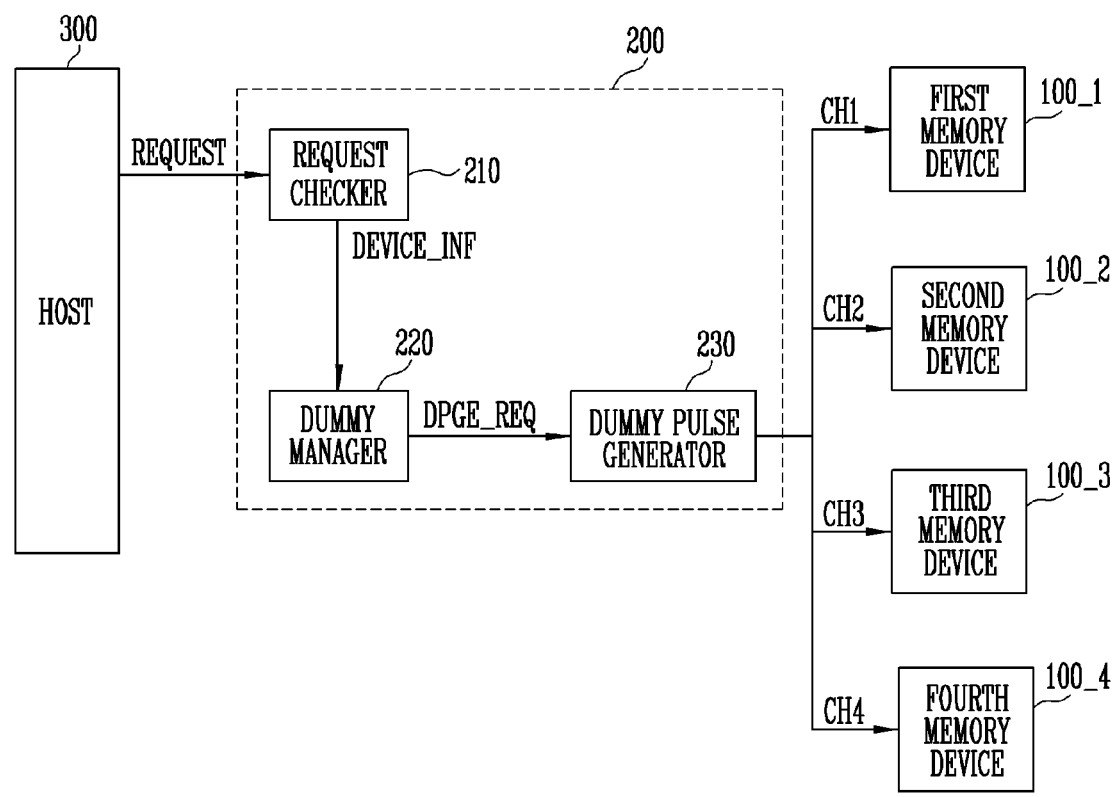
FIG. 8 is a diagram illustrating a structure of a memory controller, such as that shown in FIG. 1, which applies a dummy pulse for each channel.

FIG. 8 is a diagram illustrating a structure of the memory controller shown in FIG. 1, which applies a dummy pulse for each channel.

Referring to FIG. 8, the memory controller 200 shown in FIG. 8 may include the request checker 210, the dummy manager 220, and the dummy pulse generator 230. The memory controller 200 may also include the enable signal generator 240 and the command queue group 250 (both shown in FIG. 1), but for clarity, they are omitted in FIG. 8.

In FIG. 8, by way of example, an arrangement in which the memory device 100 in the storage device 50 (shown in FIG. 1) is provided with first to fourth memory devices 100_1 to 100_4 is illustrated. The first to fourth memory devices 100_1 to 100_4 may be coupled to the memory device 200 respectively through first to fourth channels CH1 to CH4.

Therefore, according to an embodiment of the present disclosure, a dummy pulse may be applied to the first to fourth memory devices 100_1 to 100_4 through the first to fourth channels CH1 to CH4. The dummy pulse may be input to the first to fourth channels CH1 to CH4 through an Input/Output pin (IO pin) of the memory device or through a General-Purpose Input/Output pin (GPIO pin).

In an embodiment, each of the first to fourth channels CH1 to CH4 may include not only a channel for transmitting data received from the host 300 but also a channel for applying or interrupting a dummy toggle.

In another embodiment, the storage device 50 may include a smaller or larger number of memory devices than that shown in FIG. 8.

Although not shown in the drawing, the dummy pulse may be generated through internal elements respectively included in the first to fourth memory devices 100_1 to 100_4, instead of the memory controller 200. That is, a total current consumption of the memory device may be sequentially increased or decreased through such internal elements.

In FIG. 8, an example in which the dummy pulse generator 230 in the memory controller 200 generates the dummy pulse is illustrated.

In an embodiment, the request checker 210 may receive a request (REQUEST) from the host 300. The request received from the host 300 may be a program request, read request or erase request. The request received from the host 300 may be a request for any one of the first to fourth memory devices 100_1 to 100_4.

The request checker 210 may check which memory device among the first to fourth memory devices 100_1 to 100_4 the received request is for. That is, the request checker 210 may identify which memory device(s) among the first to fourth memory devices 100_1 to 100_4, has started an operation based on the request received from the host 300. Subsequently, the request checker 210 may generate device information DEVICE_INF including information identifying the memory device(s) in which an operation is started, and provide the generated device information to the dummy manager 220.

In an embodiment, the request checker 210 may provide the dummy manager 220 with a warm-up enable signal together with or instead of the device information DEVICE_INF. The warm-up enable signal may represent which, and how many, channels are coupled to memory devices in which operations are started among the first to fourth memory devices 100_1 to 100_4. That is, the warm-up enable signal may represent a number of memory devices on which operations are performed, channels coupled to the corresponding memory devices, and numbers of the channels.

In an embodiment, the request checker 210 may identify the memory devices in which operations are started, based on the request received from the host 300, and then output the warm-up enable signal.

Therefore, in order to provide the dummy manager 220 with information on the memory devices in which operations are started, the request checker 210 may output the warm-up enable signal together with or instead of the device information DEVICE_INF.

In an embodiment, the dummy manager 220 may output a dummy pulse generation request DPGE_REQ to the dummy pulse generator 230, based on the device information DEVICE_INF and/or the warm-up enable signal, received from the request checker 210. That is, the dummy manager 220 may control a current to be applied to channels coupled to memory devices in which operations are started. The device information DEVICE_INF and the warm-up enable signal may indicate two or more memory devices in which operations are started.

Specifically, when the device information DEVICE_INF and/or the warm-up enable signal represent that only one memory device performs an operation, the dummy manager 220 may not operate to apply current control. However, when the device information DEVICE_INF and/or the warm-up enable signal represent that two or more memory devices perform operations, the dummy manager 220 may control a current to be applied to channels before the memory devices coupled to those channels start the operations.

In an example, information representing that the first and second memory devices 100_1 and 100_2, coupled to channels CH1 and CH2 respectively, are to start operations may be included in the device information DEVICE_INF or the warm-up enable signal and may be output. The dummy manager 220 may output the dummy pulse generation request DPGE_REQ for requesting the dummy pulse to be sequentially applied to the first and second channels CH1 and CH2 based on the device information DEVICE_INF or the warm-up enable signal.

The dummy pulse generator 230 may generate the dummy pulse before the first and second memory devices 100_1 and 100_2 start the operations, based on the dummy pulse generation request DPGE_REQ, and apply the dummy pulse to the first channel CH1 coupled to the first memory device 100_1 or the second channel CH2 coupled to the second memory device 100_2. That is, the dummy pulse generator 230 may first apply the dummy pulse to one of the two channels respectively coupled to two memory devices in which operations are started. Subsequently, after a set time elapses from the first application of the dummy pulse to one channel, the dummy pulse generator 230 may apply the dummy pulse to the other channel associated with the other memory device.

In another example, information representing that the first to fourth memory devices 100_1 to 100_4 are coupled to four channels CH1 to CH4 respectively, are to start operations may be included in the device information DEVICE_INF or the warm-up enable signal and may be output. The dummy manager 220 may output the dummy pulse generation request DPGE_REQ for requesting the dummy pulse to be sequentially applied to the first to fourth channels CH1 to CH4 based on the device information DEVICE_INF or the warm-up enable signal.

The dummy pulse generator 230 may generate the dummy pulse before the first to fourth memory devices 100_1 to 100_4 start the operations, based on the dummy pulse generation request DPGE_REQ, and apply the dummy pulse to the first channel CH1, the second channel CH2, the third channel CH3, or the fourth channel CH4. That is, the dummy pulse generator 230 may apply the dummy pulse to one of four channels coupled to a memory device in which an operation is started. Subsequently, after a set time elapses from a previous application of the dummy pulse, the dummy pulse generator 230 may apply the dummy pulse to a channel coupled to one of the remaining memory devices. Thus, the dummy pulse may be sequentially applied to the channels associated with memory devices in which operations are performed.

Sequentially applying the dummy pulse as described above, prevents instantaneous change in total current consumption of memory devices, and prevents occurrence of noise in the system.

In another embodiment, the memory controller 200 does not receive the request REQUEST from the host 300. Instead, the memory controller 200 may autonomously generate the dummy pulse and apply the dummy pulse to the first to fourth channels CH1 to CH4. That is, before the first to fourth memory devices 100_1 to 100_4 start operations, the memory controller 200 may autonomously generate the dummy pulse and apply the dummy pulse to each channel.

For example, when an operation of any one of the first to fourth memory devices 100_1 to 100_4 is required based on an internal operation of the memory device 200, such as Garbage Collection (GC), the memory controller 200 may autonomously generate the dummy pulse and apply the dummy pulse to a channel. Therefore, the memory controller 200 may autonomously generate the dummy pulse, even in the absence of the request REQUEST received from the host 300.

Figure 9:
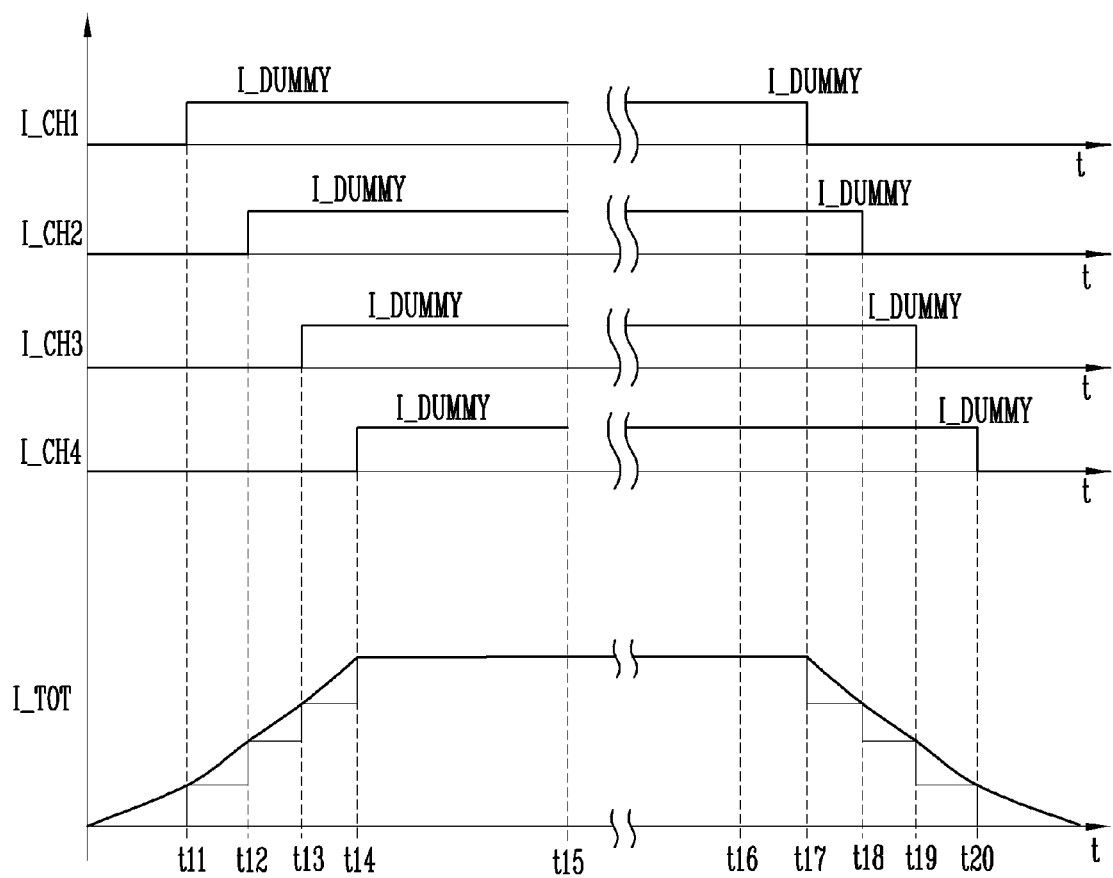
FIG. 9 is a diagram illustrating a method for sequentially increasing and decreasing a total current consumption.

FIG. 9 is a diagram illustrating a method for sequentially increasing and decreasing a total current consumption.

Referring to FIGS. 8 and 9, FIG. 9 illustrates channel currents I_CH1 to I_CH4 and a total current consumption I_TOT according to an operation of the dummy pulse generator 230 (shown in FIG. 8) after information representing that the first to fourth memory devices 100_1 to 100_4 are to start operation is included in the device information DEVICE_INF or the warm-up enable signal, and the dummy manager 220 outputs the dummy pulse generation request for requesting the dummy pulse to be sequentially applied to the first to fourth channels CH1 to CH4 respectively coupled to the first to fourth memory devices 100_1 to 100_4, based on the device information DEVICE_INF or the warm-up enable signal.

In an embodiment, when it is determined that the first to fourth memory devices are to start the operations, at t11, the dummy pulse may be applied to one channel coupled to one memory device, which channel may be the first, second, third or fourth. Here, by way of example, the dummy pulse is first applied to the first channel.

At t11, when the dummy pulse is applied to the first channel, a first channel current I_CH1 may increase to a dummy current I_DUMMY. Therefore, the total current consumption I_TOT may also increase.

Subsequently, at t12, the dummy pulse may be applied to one of the remaining channels coupled to the second memory device. t12 may occur a set time after t11. Here, by way of example, that channel is the second channel.

At t12, when the dummy pulse is applied to the second channel, a second channel current I_CH2 may increase to the dummy current I_DUMMY. Therefore, the total current consumption I_TOT may also increase.

Subsequently, the dummy pulse may be sequentially applied to the other remaining channels. For example, at t13, the dummy pulse may be applied to the third channel, so that a third channel current I_CH3 becomes the dummy current I_DUMMY. At t14, which may occur a set amount of time after t13, the dummy pulse may be applied to the fourth channel, so that a fourth channel current I_CH4 becomes the dummy current I_DUMMY.

That is, the dummy manager (220 shown in FIG. 8) may sequentially increase the total current consumption I_TOT by determining a set time and a channel to which the dummy pulse is to be applied. In addition, the total current consumption I_TOT may be sequentially increased by adjusting a level of the dummy pulse or a duration of the dummy pulse.

A method for sequentially increasing the total current consumption I_TOT by adjusting the level of the dummy pulse is described below with reference to FIG. 10.

Therefore, the total current consumption I_TOT may be sequentially increased from t11 to t14. When the sequentially increased current reaches a certain level, memory devices determined to perform operations may perform the respective operations. That is, after t15, the memory devices may perform the respective operations. Here, right after the respective operations are performed, the dummy manager 220 may determine interrupting the applying a dummy pulse. Namely, since the memory devices start to operate, the dummy pulse no longer needs to be generated for increasing the total current consumption progressively.

Consequently, when the total current consumption I_TOT is sequentially increased, noise may not occur in the voltage source Vsource. Thus, the dummy pulse generator 230 sequentially applies the dummy pulse to channels, so that the reliability of operations performed by memory devices can be ensured.

It may be determined that the first to fourth memory devices all end the operations after the first to fourth memory devices perform the operations.

When the first to fourth memory devices simultaneously end the operations, the total current consumption I_TOT of the memory devices may be rapidly decreased. Therefore, the dummy pulse may be applied to the first to fourth channels respectively coupled to the first to fourth memory devices. Subsequently, the dummy pulses applied to the respective channels may be sequentially interrupted. That is, after applying the dummy pulse is interrupted, the dummy pulses are applied to respective channels coupled to the first to fourth memory devices.

For example, at t16, when it is determined that the first to fourth memory devices do not perform the operations, the dummy pulse may be applied to the first to fourth channels.

That is, at t16, the first to fourth channel currents I_CH1 to I_CH4 may become the dummy current I_DUMMY.

Subsequently, at t17, which may occur a set amount of time after t16, the dummy pulse generator 230 may interrupt the dummy pulse applied to one of the channels, which may be the first, second, third or fourth channel. Here, by way of example, the dummy pulse in the first channel is interrupted at t16.

At t17, when the application of the dummy pulse to the first channel is ended, the first channel current I_CH1 may be decreased. Therefore, the total current consumption I_TOT may also be decreased.

Subsequently, at t18, the dummy pulse applied to the second channel coupled to the second memory device may be interrupted. t18 may occur a set amount of time after t17. More generally, at t18, the channel in which the dummy pulse is interrupted may be any of the channels in which the dummy pulse has not yet been interrupted.

At t18, when the dummy pulse is interrupted from the second channel, the second channel current I_CH2 may be decreased. Therefore, the total current consumption I_TOT may also be decreased.

Subsequently, the dummy pulse may be sequentially interrupted in the other channels. For example, at t19, which may occur a set amount of time after t18, the dummy pulse applied to the third channel may be interrupted. At t20, which may occur a set amount of time after t19, the dummy pulse applied to the fourth channel may be interrupted.

Therefore, the total current consumption I_TOT may be sequentially decreased from t17 to t20. Consequently, when the total current consumption I_TOT is sequentially decreased, noise may not occur in the voltage source Vsource. Thus, the dummy pulses applied to the channels are sequentially interrupted, so that the reliability of the operations performed by the memory devices can be ensured.

Figure 10:
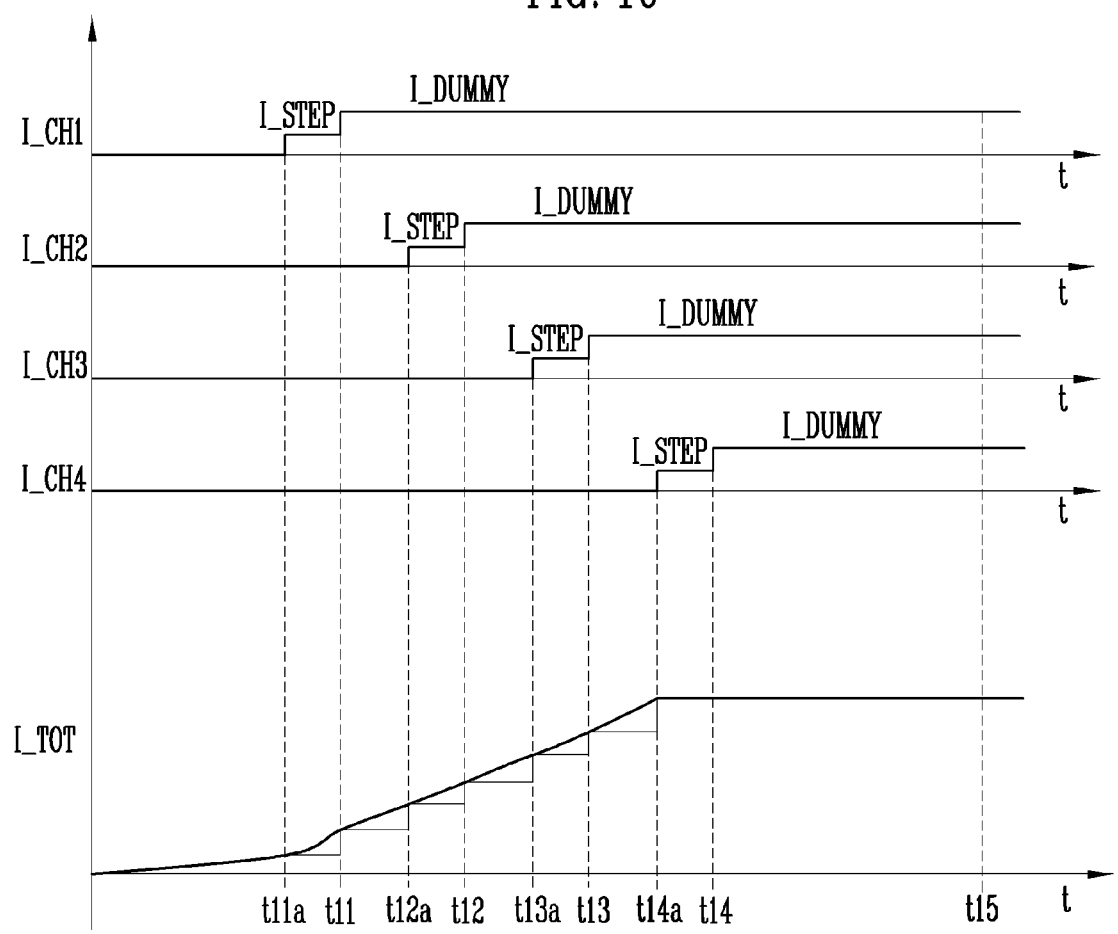
FIG. 10 is a diagram illustrating another embodiment of sequentially increasing and decreasing a total current consumption.

FIG. 10 is a diagram illustrating another embodiment of sequentially increasing and decreasing a total current consumption.

Referring to FIGS. 8, 9, and 10, FIG. 10 illustrates an embodiment in which more subdivided dummy pulses are applied from t11 to t14 shown in FIG. 9. FIG. 10 illustrates channel currents I_CH1 to I_CH4 and a total current consumption according to an operation of the dummy pulse generator 230 after information representing that the first to fourth memory devices (100_1 to 100_4 shown in FIG. 8) are to start operation is included in the device information, and the dummy manager 220 outputs the dummy pulse generation request for requesting the dummy pulse to be sequentially applied to the first to fourth channels CH1 to CH4 respectively coupled to the first to fourth memory devices 100_1 to 100_4, based on the device information.

In describing FIG. 10, content already described in connection with FIG. 9 is omitted.

In an embodiment, the dummy manager 220 may determine that the dummy pulse is to be applied first to the first channel coupled to the first memory device among the first to fourth memory devices. The dummy pulse generator 230 may generate the dummy pulse step by step. The dummy pulse generator 230 may generate the dummy pulse by adjusting a level of the dummy pulse. Therefore, the dummy pulse generator 230 may generate the dummy pulse such that the total current consumption is increased step by step.

For example, at t11a, the dummy pulse generator 230 may generate a dummy pulse and apply the dummy pulse to the first channel, and the first channel current I_CH1 may become a step current I_STEP. Subsequently, at t11, the dummy pulse generator may generate a dummy pulse having a level higher than that of the previous dummy pulse and apply the dummy pulse to the first channel, and the first channel current I_CH1 may become the dummy current I_DUMMY.

Like the arrangement in FIG. 9, in the arrangement of FIG. 10, the dummy pulse generator 230 applies the dummy pulse through the first channel, and the first channel current I_CH1 becomes the dummy current I_DUMMY. However, in the arrangement of FIG. 10, the dummy pulse generator 230 applies pulses having different levels to the first channel, so that a change in the total current consumption can be minimized.

The dummy pulse may also be applied step by step to the second to fourth channels.

For example, after a reference time elapses, at t12a, the second channel current I_CH2 may become the step current I_STEP by applying a dummy pulse to the second channel. At t12, the second channel current I_CH2 may become the dummy current I_DUMMY by applying, to the second channel, a dummy pulse having a level higher than that of the previous dummy pulse.

In addition, after the reference time elapses, at t13a, the third channel current I_CH3 may become the step current I_STEP by applying a dummy pulse to the third channel. At t13, the third channel current I_CH3 may become the dummy current I_DUMMY by applying, to the third channel, a dummy pulse having a level higher than that of the previous dummy pulse.

Finally, at t14a, the fourth channel current I_CH4 may become the step current I_STEP by applying a dummy pulse to the fourth channel. At t14, the fourth channel current I_CH4 may become the dummy current I_DUMMY by applying, to the fourth channel, a dummy pulse having a level higher than that of the previous dummy pulse.

Consequently, the dummy pulse applied to the first to fourth channels is subdivided, so that the total current consumption can be more gradually increased. Thus, it is less likely that noise will occur in the voltage source, so that the reliability of an operation performed by the memory device can be increased.

The above-described method may be also be applied when the dummy pulses applied to the respective channels are sequentially interrupted. That is, the dummy pulse interrupted for each channel is subdivided, so that the total current consumption can be more gradually decreased. Thus, it is less likely that noise will occur in the voltage source, so that the reliability of an operation performed by the memory device can be ensured.

Figure 11:
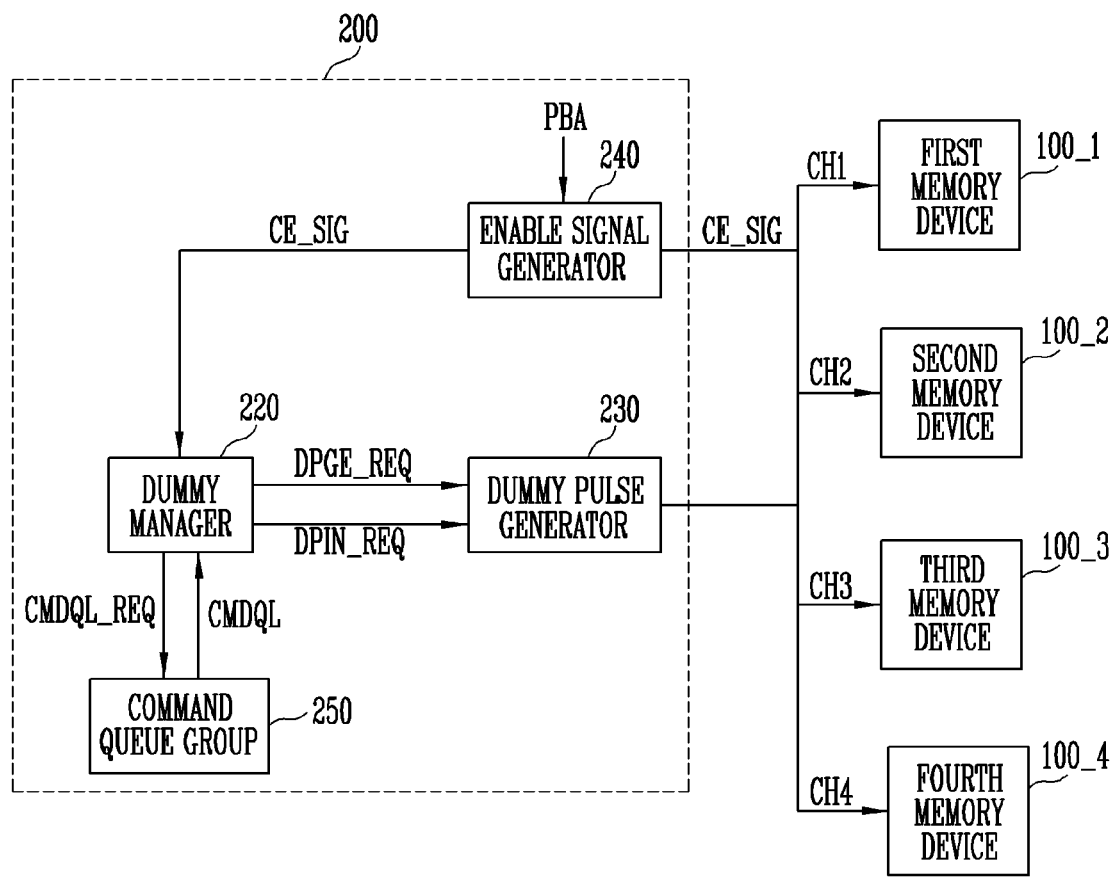
FIG. 11 is a diagram illustrating a structure of the memory controller shown in FIG. 1, which sequentially decreases a total current consumption.

FIG. 11 is a diagram illustrating a structure of the memory controller shown in FIG. 1, which sequentially decreases a total current consumption.

Referring to FIG. 11, the memory controller 200 shown in FIG. 11 may include the dummy manager 220, the dummy pulse generator 230, the enable signal generator 240, and the command queue group 250. The memory controller 200 may also include the request checker 210 shown in FIG. 1 but such component is omitted here for clarity.

FIG. 11 illustrates a method for interrupting a dummy pulse when it is determined that at least one memory device among the first to fourth memory devices 100_1 to 100_4 has ended or suspended performance of an operation.

In an embodiment, each of first to fourth channels CH1 to CH4 may include not only a channel for transmitting data received from the host 300 but also a channel for applying or interrupting a dummy toggle.

In an embodiment, the enable signal generator 240 may generate a chip enable signal CE_SIG corresponding to a physical block address PBA, and output the generated chip enable signal CE_SIG to a selected memory device and the dummy manager 220. The chip enable signal CE_SIG may be for selecting a memory device on which an operation is performed or releasing the selection. The chip enable signal CE_SIG may be in a high state or low state. When the chip enable signal CE_SIG is in the high state, the selection of the memory device may be released. When the chip enable signal CE_SIG in the low state, the memory device may be selected. In other words, a high-state chip enable signal CE_SIG may be input to the memory device in a standby state, and a low-state chip enable signal CE_SIG may be input to the memory device that is operating.

For example, when the first memory device 100_1 is to end an operation, the enable signal generator 240 may generate a chip enable signal CE_SIG in the high state, which releases the selection of the first memory device 100_1. The enable signal generator 240 may provide the generated chip enable signal CE_SIG to the dummy manager 220.

The dummy manager 220 may determine whether a chip enable signal CE_SIG in the high state, which corresponds to at least two memory devices, has been received in response to the chip enable signal CE_SIG received from the enable signal generator 240.

When the dummy manager 220 receives a chip enable signal CE_SIG in the high state, which corresponds to two or more memory devices, the dummy manager 220 may output, to the command queue group 250, a command queue level request CMDQL_REQ for checking a command queue level CMDQL of a corresponding memory device. The command queue level CMDQL may be indicative of a number of commands queued in a command queue. That is, when the number of the queued command is "0," the command queue level CMDQL may be "0." When the number of the queued command is "5," the command queue level CMDQL may be "5."

The command queue group 250 may output a command queue level CMDQL corresponding to the corresponding memory device, to the dummy manager 220 in response to the command queue level request CMDQL_REQ received from the dummy manager 220.

In an embodiment, the dummy manager 220 may determine a channel to which the dummy pulse is to be applied, based on the chip enable signal CE_SIG in the high state and the command queue level CMDQL.

For example, when command queue levels CMDQL of all the memory devices are "0," the dummy manager 220 may determine to apply the dummy pulse to all the memory devices and then sequentially interrupt the dummy pulse.

However, when command queue levels CMDQL of some but not all memory devices are "0," the dummy manager 220 may apply the dummy pulse to only channels coupled to the memory devices of which command queue levels CMDQL are not "0." That is, the dummy pulse is applied to memory devices predicted to again perform operations within a short time, so that a total current consumption is prevented from being rapidly increased or decreased. The number of memory devices of which command queue levels CMDQL are not "0" may be 1.

After the dummy pulse is applied to only remaining memory devices of which command queue levels CMDQL are not "0", the dummy manager 220 may again receive the chip enable signal CE_SIG in the high state from the enable signal generator 240. When the dummy manager 220 receives a chip enable signal CE_SIG in the high state, which corresponds to at least two memory devices, the dummy manager 220 may receive command queue levels CMDQL corresponding to memory devices of the high-state chip enable signal CE_SIG and then determine whether the dummy pulse is to be applied or interrupted.

FIG. 12 is a diagram illustrating application or interruption of a dummy pulse, which is determined based on a command queue.

Referring to FIGS. 11 and 12, first to fourth command queues CMD_QUEUE1 to CMD_QUEUE4 shown in FIG. 12 respectively correspond to the first to fourth memory devices (100_1 to 100_4 shown in FIG. 11), and each column shown in FIG. 12 represents a sequence of commands to be executed by a corresponding memory device.

In an embodiment, first to fifth commands CMD1 to CMD5 may be queued in the first command queue CMD_QUEUE1 corresponding to the first memory device, sixth and seventh commands CMD6 and CMD7 may be queued in the second command queue CMD_QUEUE2 corresponding to the second memory device, eighth to eleventh commands CMD8 to CMD11 may be queued in the third command queue CMD_QUEUE3 corresponding to the third memory device, and twelfth to fourteenth commands CMD12 to CMD14 may be queued in the fourth command queue CMD_QUEUE4 corresponding to the fourth memory device.

FIG. 12 shows exemplary numbers and sequences of commands queued in the respective queues. The numbers and sequences, however, may vary.

In an embodiment, the first to fourth memory devices may simultaneously perform operations. That is, the first memory device, the second memory device, the third memory device, and the fourth memory device may simultaneously perform operations respectively corresponding to the first command CMD1, the sixth command CMD6, the eighth command CMD8, and the twelfth command CMD12.

Referring to FIG. 9, before the first to fourth memory devices perform operations corresponding to the respective commands, a dummy pulse may be sequentially applied to the first to fourth channels respectively coupled to the first to fourth memory devices. When the dummy pulse is sequentially applied to the first to fourth channels, a total current consumption of the memory devices may be sequentially increased. Therefore, when the total current consumption is sequentially increased, voltage noise may not occur.

When the first to fourth channel currents become the dummy current as the dummy pulse is applied to the first to fourth channels, the first to fourth memory devices may perform the operations corresponding to the respective commands.

In an embodiment, the first to fourth memory devices may execute next commands. That is, the first memory device may perform an operation corresponding to the second command CMD2, the second memory device may perform an operation corresponding to the seventh command CMD7, the third memory device may perform an operation corresponding to the ninth command CMD9, and the fourth memory device may perform an operation corresponding to the thirteenth command CMD13.

Since no memory device among the first to fourth memory devices has ended or suspended operation, the enable signal generator 240 may generate a chip enable signal in a low state, which corresponds to the first to fourth memory devices. Therefore, it is unnecessary for the dummy manager 220 to perform an operation for sequentially decreasing the total current consumption of the memory devices.

However, when it is determined that, for example, the second and third memory devices end their operations after the first to fourth memory devices perform the respective operations, the enable signal generator 240 may generate a chip enable signal in a high state, which corresponds to the second and third memory devices. After the second memory device performs the operation corresponding to the seventh command CMD7, the second memory device may end the operation. After the third memory device performs the operation corresponding to the ninth command CMD9, the third memory device may end the operation.

Since no current is consumed in the two memory devices, the total current consumption may be rapidly decreased. Therefore, the dummy manager 220 may receive the chip enable signal in the high state, which corresponds to the second and third memory devices, and then output, to the command queue group 250, a command queue level request for checking command queue levels of the second and third memory devices.

In an embodiment, the command queue group 250 may output a command queue level in response to the command queue level request from the dummy manager 220. Since the second memory device performed the operations corresponding to the sixth and seventh commands CMD6 and CMD7, a number of commands queued in a command queue corresponding to the second memory device may be "0." In addition, since the third memory device performed the operations corresponding to the eighth and ninth commands CMD8 and CMD9, commands queued in a command queue corresponding to the third memory device may be the tenth and eleventh commands CMD10 and CMD11, and a number of the commands may be "2."

Consequently, in response to the command queue level request from the dummy manager, the command queue group 250 may output, to the dummy manager 220, the command queue level "0" corresponding to the second memory device and the command queue level "2" corresponding to the third memory device.

Since both the command queue levels corresponding to the second and third memory devices are not "0," the dummy manager may determine that the dummy pulse is applied to only the third memory device of which the command queue level is not "0." The dummy manager 220 may output, to the dummy pulse generator 230, a dummy pulse generation request for requesting application of the dummy pulse to the third memory device, and the dummy pulse generator 230 may apply the dummy pulse to the third channel coupled to the third memory device.

In an embodiment, although not shown in the drawing, when both the command queue levels corresponding to the second and third memory devices are "0," the dummy pulse may be applied to the channels respectively coupled to the second and third memory devices. When a set time elapses after the dummy pulse is applied to the second and third channels, the dummy pulses applied to the second and third channels may be sequentially interrupted.

Subsequently, it may be determined that the first and fourth memory devices end operations. That is, a chip enable signal in the high state corresponding to the first and fourth memory devices may be generated. After the first memory device performs an operation corresponding to the third command CMD3, the first memory device may end the operation. After the fourth memory device performs an operation corresponding to the fourteenth command CMD14, and the fourth memory device may end the operation.

Since no current is consumed in the two memory devices, the total current consumption may be rapidly decreased. Therefore, the dummy manager 220 may receive the chip enable signal in the high state, which corresponds to the first and fourth memory devices, and then output, to the command queue group 250, a command queue level request for checking command queue levels of the first and fourth memory devices.

In an embodiment, the command queue group 250 may output a command queue level in response to the command queue level request from the dummy manager 220. Since the first memory device performed the operations corresponding to the first, second, and third commands CMD1, CMD2, and CMD3, commands queued in a command queue corresponding to the first memory device may be the fourth and fifth commands CMD4 and CMD5, and a number of the commands may be "2." In addition, since the fourth memory device performed the operations corresponding to the twelfth to fourteenth commands CMD12 to CMD14, a number of commands queued in a command queue corresponding to the fourth memory device may be "0."

Consequently, in response to the command queue level request from the dummy manager, the command queue group 250 may output, to the dummy manager 220, the command queue level "2" corresponding to the first memory device and the command queue level "0" corresponding to the fourth memory device.

Since both of the command queue levels corresponding to the first and fourth memory devices are not "0," the dummy manager may determine that the dummy pulse is applied to only the first memory device of which the command queue level is not "0." The dummy manager 220 may output, to the dummy pulse generator 230, a dummy pulse generation request for requesting application of the dummy pulse to the first memory device, and the dummy pulse generator 230 may apply the dummy pulse to the first channel coupled to the first memory device.

Subsequently, the first memory device may perform an operation corresponding to the fourth command CMD4, and the third memory device may perform an operation corresponding to the eleventh command CMD11.

In an embodiment, it may be determined that, after the third memory device performs the operation corresponding to the eleventh command CMD11, the third memory device ends the operation. That is, a chip enable signal in the high state corresponding to the third memory device may be generated. The third memory device may end the operation after the third memory device performs the operation corresponding to the eleventh command CMD11. However, since only the third memory device among the plurality of memory devices ends the operation, it is unnecessary for the dummy manager 220 to perform an operation for applying or interrupting the dummy pulse.

Consequently, when the memory devices start operations, the total current consumption of the memory devices may be sequentially increased. Then, when the memory devices end operations, the total current consumption of the memory devices may be sequentially decreased. Thus, through the above-described process, a case in which the total current consumption is increased or decreased is prevented, so that occurrence of power noise can be prevented.

Figure 13:
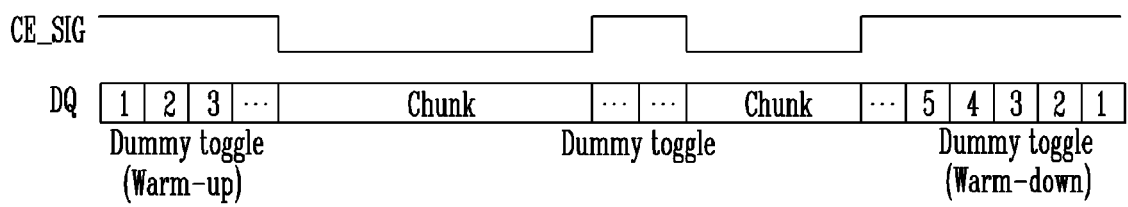
FIG. 13 is a diagram illustrating a dummy pulse output based on a chip enable signal.

FIG. 13 is a diagram illustrating a dummy pulse output based on a chip enable signal.

Referring to FIG. 13, FIG. 13 illustrates a dummy toggle (Dummy toggle) and data (Chunk), input through an input/output pin DQ, based on a chip enable signal CE_SIG.

In an embodiment, when the memory device 100 does not operate, a chip enable signal CE_SIG corresponding to the corresponding memory device may be output in a high state. However, when the memory device 100 is operating (e.g., when data is transmitted or received through the input/output pin DQ), a chip enable signal CE_SIG corresponding to the corresponding memory device may be output in a low state.

In an embodiment, when data is transmitted or received through the input/output pin DQ, the total current consumption of the memory device 100 may be instantaneously increased or decreased. Therefore, in order to prevent the total current consumption of the memory device 100 from being instantaneously increased, a dummy toggle may be applied to the memory device 100 through the input/output pin DQ. Here, the dummy toggle is a pulse of a certain magnitude that is applied to the memory device 100.

That is, when the chip enable signal CE_SIG is in the high state, the dummy toggle may be applied through the input/output pin DQ of the memory device 100, and the total current consumption of the memory device 100 may be increased step by step (Warm-up). The magnitude of the dummy toggle may be sequentially increased (1, 2, 3, . . . ).

Consequently, before the memory device starts an operation, the dummy toggle of which magnitude is sequentially increased, is applied to the memory device 100, so that an instantaneous increase in total current consumption can be prevented.

When the total current consumption of the memory device 100 is instantaneously increased through the dummy toggle and then reaches a certain level, the memory device 100 may transmit or receive data.

Although the transmission or reception of the data is ended, i.e., when it is predicted that the memory device 100 will transmit or receive the data Chunk, a dummy toggle may be applied to the memory device 100. That is, since the memory device 100 immediately starts an operation, the dummy toggle for maintaining the total current consumption to a certain level may be applied to the memory device (100. Subsequently, the memory device 100 may again transmit or receive data.

In an embodiment, even when the memory device 100 ends the operation, a dummy toggle may be applied to the memory device 100 to prevent the total current consumption from being instantaneously decreased.

For example, when the chip enable signal CE_SIG is output in the high state since it is determined that the memory device 100 ends the operation, a dummy toggle may be applied to the memory device (100 and then sequentially interrupted (Warm-down). That is, after the dummy toggle is applied to the memory device 100 determined to end the operation, the magnitude of the dummy toggle may be sequentially decreased.

Consequently, before the memory device ends the operation, the dummy toggle of which the magnitude is sequentially decreased is applied to the memory device 100, so that an instantaneous decrease in total current consumption can be prevented.

Figure 14:
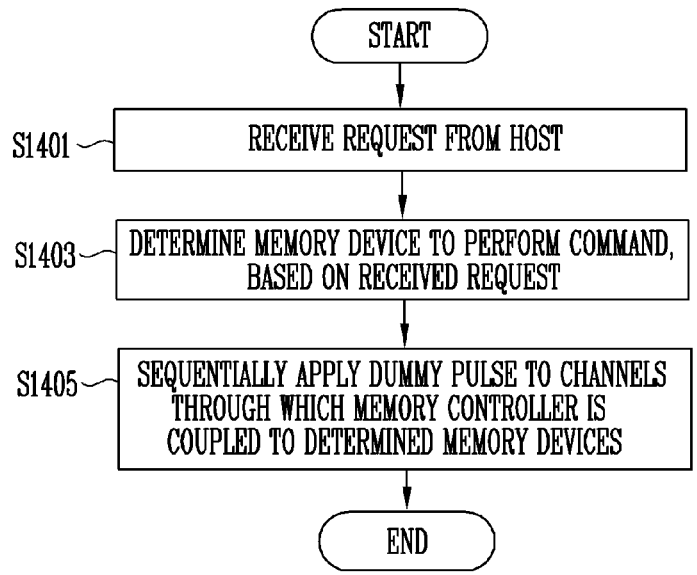
FIG. 14 is a diagram illustrating an operation of the memory controller in accordance with an embodiment of the present disclosure.

FIG. 14 is a diagram illustrating an operation of the memory controller in accordance with an embodiment of the present disclosure.

FIG. 14 illustrates a sequence in which, when memory devices start operations, a dummy pulse is applied to channels connecting the memory controller to the memory devices.

In step S1401, the memory controller may receive a request from the host. The request received from the host may be a program request, read request or erase request for any one memory device among a plurality of memory devices included in the storage device. That is, the memory controller may determine which memory device among the plurality of memory devices an operation is to be performed on, based on the request received from the host.

In step S1403, the memory controller may determine memory devices in which a command is executed, based on the request received from the host. A number of memory devices in which the command is executed may be two or more.

In an embodiment, when multiple memory devices simultaneously perform an operation corresponding to the command, a total current consumption of the memory devices may be rapidly increased. Thus, a dummy pulse is sequentially applied to channels connecting the memory controller to the memory devices, so that the total current consumption can be gradually increased.

That is, when the memory devices to perform the operation are determined in response to the request received from host, the dummy pulse may be sequentially applied to channels through which the memory controller is coupled to such memory devices (S1405).

For example, when memory devices to execute a command corresponding to the request received from the host are determined as first and second memory devices, a dummy pulse may be sequentially applied to first and second channels through which the memory controller is coupled to the first and second memory devices. That is, the dummy pulse is first applied to the first or second channel, and then after a set time elapses from that application of the dummy pulse, the dummy pulse may be applied to the other channel. Thus, the total current consumption of the memory devices can be prevented from being instantaneously increased. Moreover, right after the operations are performed, the memory controller may determine interrupting the applying a dummy pulse. Namely, since the memory devices start to operate, the dummy pulse no longer needs to be generated for increasing the total current consumption progressively.

Figure 15:
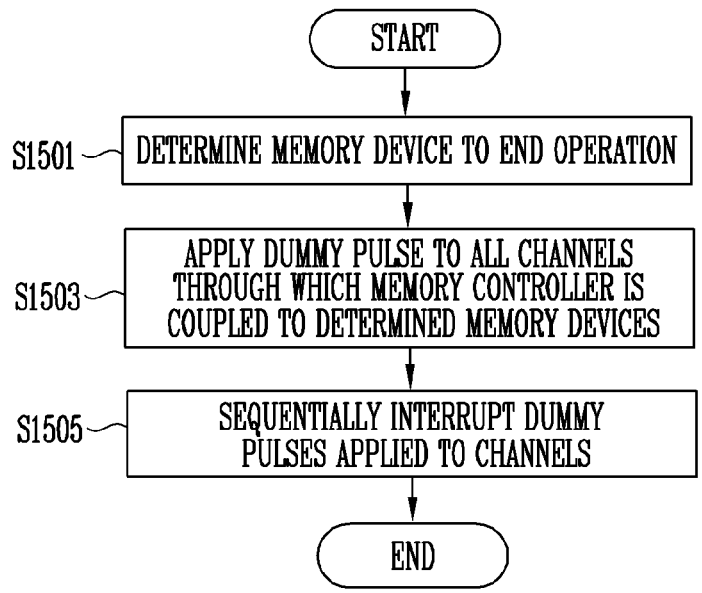
FIG. 15 is a diagram illustrating an operation of the memory controller in accordance with an embodiment of the present disclosure.

FIG. 15 is a diagram illustrating an operation of the memory controller in accordance with an embodiment of the present disclosure.

Referring to FIG. 15, when memory devices end operations, a dummy pulse is applied to, or interrupted in, channels connecting the memory controller to the memory devices.

In step S1501, the memory controller may determine a memory device to end an operation among a plurality of memory devices included in the storage device. The memory device to end the operation among the plurality of memory devices may be determined based on a chip enable signal. That is, when a chip enable signal in a high state is generated, the memory controller may determine that a memory device corresponding to the chip enable signal is to end the operation.

When memory devices to end operations are determined, a dummy pulse may be applied to all channels through which the memory controller is coupled to the determined memory devices, after the determined memory devices end the operations (S1503). That is, since the memory devices simultaneously end the operations, the end of the operations of the memory devices may be delayed to prevent a total current consumption of the memory devices from being instantaneously decreased.

After the dummy pulse is applied to the channels through which the memory controller is coupled to the memory devices to end the operations, the dummy pulses applied to the channels may be sequentially interrupted (S1505). That is, after the dummy pulse is applied to the channels, the memory controller may interrupt the dummy pulse applied to any one channel, and sequentially interrupt the dummy pulses applied to the other channels after a set time elapses.

Thus, the total current consumption of the memory devices can be prevented from being instantaneously decreased.

Figure 16:
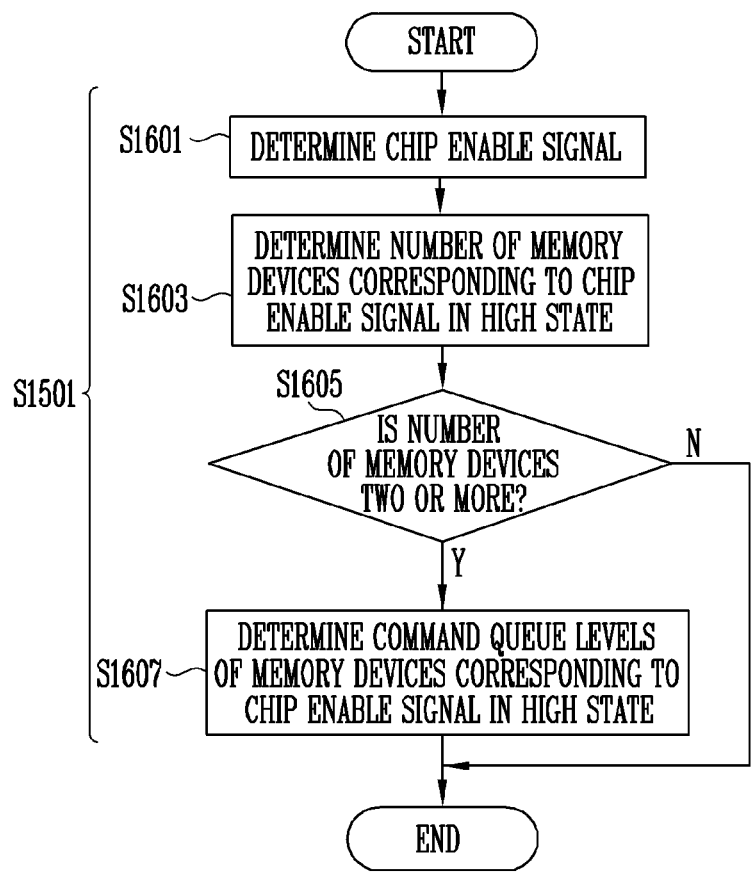
FIG. 16 is a diagram illustrating an operation of the memory controller in accordance with an embodiment of the present disclosure.

FIG. 16 is a diagram illustrating an operation of the memory controller in accordance with an embodiment of the present disclosure.

Referring to FIGS. 15 and 16, steps S1601 to S1607 correspond to step S1501. That is, steps S1601 to S1607 may be steps of determining a memory device to end an operation among a plurality of memory devices that are operating.

In step S1601, the memory controller may determine whether the generated chip enable signal is in a high state or low state. The chip enable signal may correspond to a physical block address PBA. Also, the chip enable signal may be generated for each memory device.

In an embodiment, the memory controller may determine a number of memory devices corresponding to a chip enable signal in the high state among chip enable signals corresponding to the plurality of memory devices (S1603). The memory devices corresponding to the chip enable signal in the high state may be memory devices to end operations.

Subsequently, the memory controller may determine whether a number of the memory devices corresponding to the chip enable signal in the high state is two or more (S1605). When the number of the memory devices corresponding to the chip enable signal in the high state is not two or more (N at S1605), i.e., when the number of the memory devices corresponding to the chip enable signal in the high state is 1, a total current consumption of the memory devices is not rapidly decreased even when current does not flow in the corresponding memory device. Hence, it is unnecessary for the memory controller to perform an operation for sequentially decreasing the total current consumption.

However, when the number of the memory devices corresponding to the chip enable signal in the high state is two or more (Y at S1605), the total current consumption of the memory devices may be rapidly decreased, when current does not simultaneously flow in the corresponding memory devices. Therefore, it is necessary for the memory controller to perform an operation for sequentially decreasing the total current consumption.

In an embodiment, in order to sequentially decrease the total current consumption, the memory controller may determine command queue levels of the memory devices corresponding to the chip enable signal in the high state (S1607). That is, the memory controller may determine whether a dummy pulse is to be applied to, and interrupted in, channels through which the memory controller is coupled to the corresponding memory devices.

For example, the memory controller may determine whether the dummy pulse is to be applied and interrupted, based on whether the command queue levels are all "0."

Figure 17:
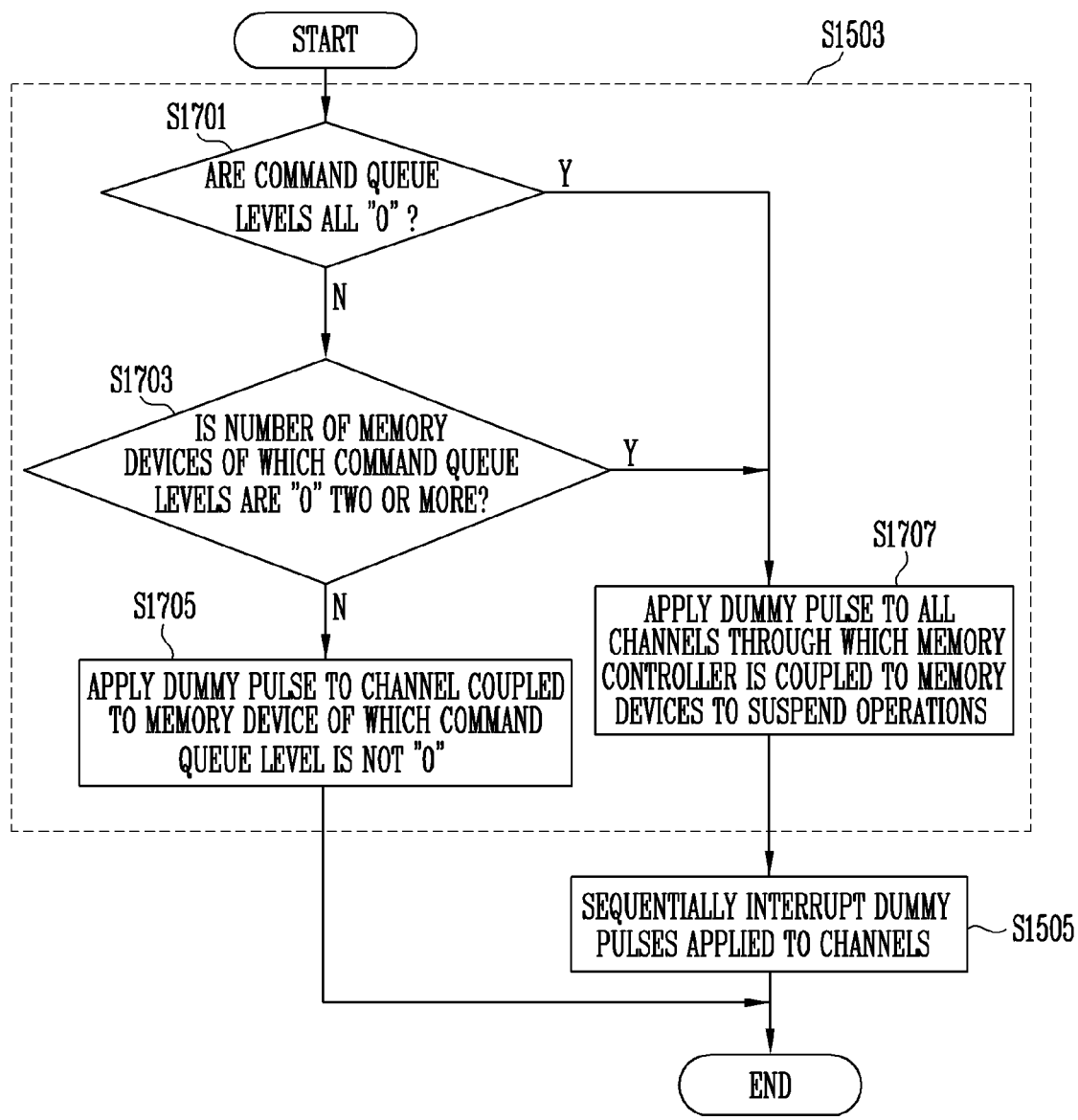
FIG. 17 is a diagram illustrating an operation of the memory controller in accordance with an embodiment of the present disclosure.

FIG. 17 is a diagram illustrating an operation of the memory controller in accordance with an embodiment of the present disclosure.

Referring to FIGS. 15 and 17, steps S1701 to S1707 correspond to step S1503.

In step S1701, the memory controller may determine whether command queue levels are all "0." That is, channels to which a dummy pulse is to be applied may be determined based on the command queue levels.

In an embodiment, when the command queue levels are not all "0" (N at S1701), the memory controller may determine whether the number of memory devices of which command queue levels are "0" is two or more (S1703). When the number of memory devices of which command queue levels are "0" is not two or more (N at S1703), i.e., when the number of memory devices of which command queue levels are "0" is 1, the memory controller may apply the dummy pulse to a channel coupled to the memory device of which command queue level is not "0" (S1705). That is, the dummy pulse may be applied to channels coupled to memory devices that currently end operations but are immediately to perform other operations again. Here, the dummy pulse is applied to the channels at the same time or gradually.

Therefore, current is not consumed in a channel coupled to a memory device to end an operation. Since a number of memory devices to end operations is 1, a total current consumption of the memory devices may not be rapidly decreased.

When the command queue levels are all "0", as determined in step S1701 (Y) or when the number of memory devices of which command queue levels are "0" is two or more, as determined in step S1703 (Y), the memory controller may apply a dummy pulse to all channels through which the memory controller is coupled to the memory devices to end or suspend the operations (S1707). That is, since it is determined that all the memory devices end operations or since it is determined that two or more memory devices end operations, the dummy pulse may be applied to all channels coupled to memory devices determined to end operations. Here, the dummy pulse is applied to the channels at the same time or gradually. Subsequently, the dummy pulses applied to the channels may be sequentially interrupted (S1505).

When the number of memory devices of which command queue levels are "0" is two or more, as determined in step S1703, the dummy pulses may be sequentially interrupted in only the channels coupled to the memory devices of which command queue levels are "0" in step S1505.

Therefore, when the dummy pulses applied to the channels are sequentially interrupted, the total current consumption of the memory devices may not be rapidly decreased.

Figure 18:
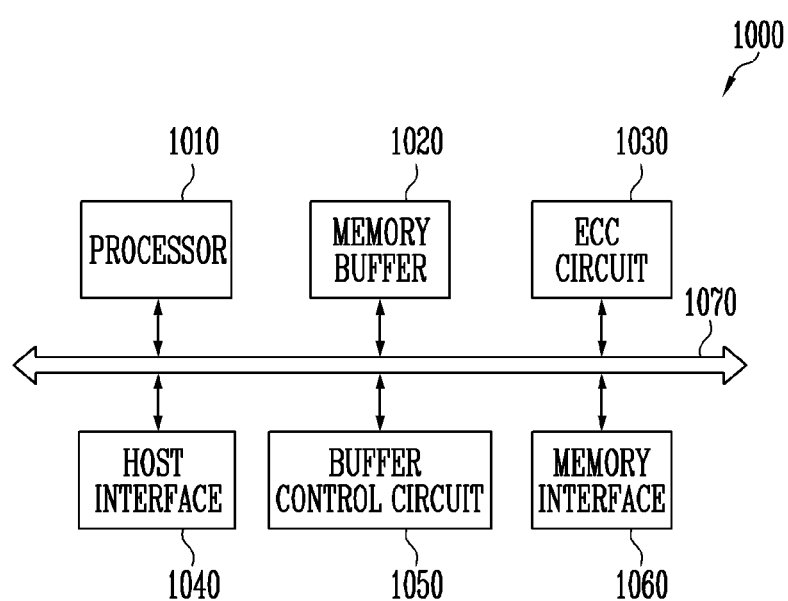
FIG. 18 is a diagram illustrating another embodiment of a memory controller, such as that shown in FIG. 1.

FIG. 18 is a diagram illustrating another embodiment of the memory controller shown in FIG. 1.

Referring to FIG. 18, a memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, and translate it into a PBA using a mapping table. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

In an embodiment, the processor 1010 may record a foggy program completion time by receiving a foggy program completion response corresponding to a foggy program command from the memory device (100 shown in FIG. 2), and output a fine program command to the memory device (100 shown in FIG. 2) according to whether a time elapsed from the foggy program completion time has exceeded a reference time.

Before the processor 1010 outputs the fine program command, the processor 1010 may output a dummy program command to the memory device (100 shown in FIG. 2) according to whether a page on which a fine program operation is performed is influenced by interference.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. Either or both of these components may be provided separately, or either or both of their functions may be distributed among other components of the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may transmit data in the memory controller 1000, and the control bus may transmit control information such as a command and an address in the memory controller 1000. The data bus and the control bus are separated from each other, so that neither interferes with nor influences the other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 19:
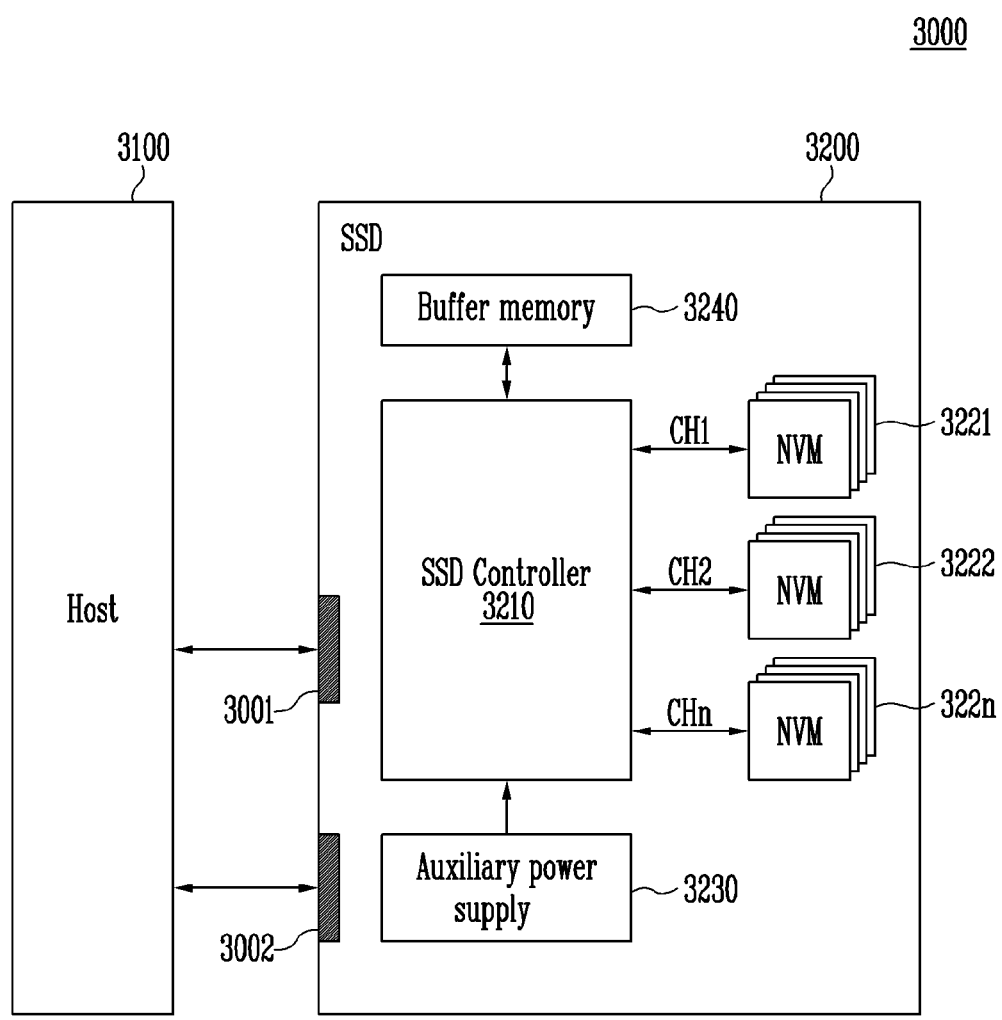
FIG. 19 is a block diagram illustrating a Solid State Drive (SSD) system to which the storage device is applied in accordance with an embodiment of the present disclosure.

FIG. 19 is a block diagram illustrating a Solid State Drive (SSD) system to which the storage device is applied in accordance with an embodiment of the present disclosure.

Referring to FIG. 19, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and/or an NVMe.

In an embodiment, when the plurality of flash memories 3221 to 322n simultaneously start or end operations, the SSD controller 3210 may apply or interrupt a dummy pulse to or from first to nth channels CH1 to CHn through which the SSD controller 3210 is coupled to the plurality of flash memories 3221 to 322n.

In an embodiment, before the plurality of flash memories 3221 to 322n simultaneously start operations, the SSD controller 3210 may sequentially apply a dummy pulse to the first to nth channels CH1 to CHn. After the dummy pulse is applied to the first to nth channels CH1 to CHn, the plurality of flash memories 3221 to 322n may simultaneously start the operations.

In addition, when the plurality of flash memories 3221 to 322n simultaneously end operations, the SSD controller 3210 may apply a dummy pulse to the first to nth channels CH1 to CHn after the plurality of flash memories 3221 to 322n end the operations, and sequentially interrupt the dummy pulses applied to the first to nth channels CH1 to CHn.

The auxiliary power supply 3230 is connected to the host 3100 through the power connector 3002. When the supply of power from the host 3100 is not smooth, the auxiliary power supply 3230 may provide power to the SSD 3200. In an example, the auxiliary power supply 3230 may be located in the SSD 3200, or be disposed externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include any of various types of volatile memories such as a DRAM, an SDRAM, a DDR SDRAM, an LPDDR SDRAM, and/or a GRAM or any of various types of nonvolatile memories such as a FRAM, a ReRAM, an STT-MRAM, and/or a PRAM.

Figure 20:
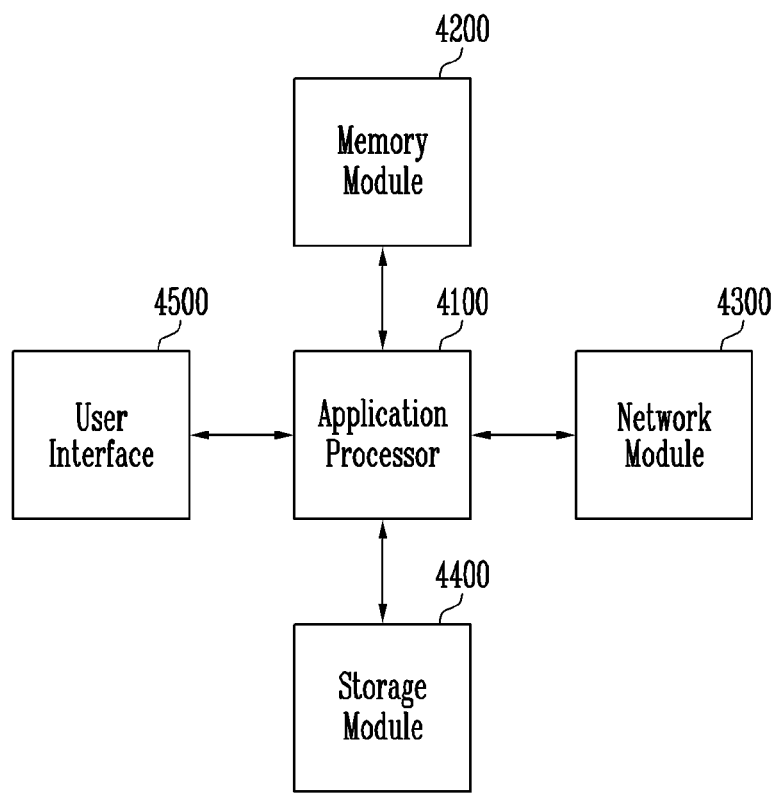
FIG. 20 is a block diagram exemplarily illustrating a user system to which the storage device is applied in accordance with an embodiment of the present disclosure.

FIG. 20 is a block diagram illustrating a user system to which the storage device is applied in accordance with an embodiment of the present disclosure.

Referring to FIG. 20, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

In an embodiment, when a plurality of memory devices included in the storage module 4400 simultaneously start or end operations, the application processor 4100 may apply or interrupt a dummy pulse to or from channels through which the application processor 4400 is coupled, to the plurality of memory devices.

In an embodiment, before the plurality of memory devices included in the storage module 4400 simultaneously start operations, the application processor 4100 may sequentially apply a dummy pulse to the channels. After the dummy pulse is applied to all the channels, the plurality of memory devices in the storage module 4400 may simultaneously start the operations.

In addition, when the plurality of memory devices in the storage module 4400 simultaneously end operations, the application processor 4100 may apply a dummy pulse to the channels after the plurality of memory devices end the operations, and sequentially interrupt the dummy pulses applied to the channels.

The memory module 4200 may operate as a main memory, working memory, buffer memory or cache memory of the user system 4000. The memory module 4200 may include any of various types of volatile random access memories such as a DRAM, an SDRAM, a DDR SDRAM, a DDR2 SDRAM, a DDR3 SDRAM, an LPDDR SDRAM, an LPDDR2 SDRAM, and/or an LPDDR3 SDRAM or any of various types of nonvolatile random access memories such as a PRAM, a ReRAM, an MRAM, and/or a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, each of which may operate the same as the memory device described with reference to FIGS. 2 and 3. The storage module 4400 may operate the same as the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, a number of channels coupled to memory devices to start operations is determined based on a request received from the host, total current is sequentially increased based on the determined number of channels, a number of channels coupled to memory devices to end operations is determined based on a chip enable signal and a command queue, and current may be sequentially decreased based on the determined number of channels.

While the present disclosure has been shown and described with reference to certain embodiments thereof, it will be understood by those skilled in the art that various changes in form and details may be made therein without departing from the spirit and scope of the present invention as defined by the appended claims and their equivalents. Therefore, the scope of the present invention should not be limited to the above-described embodiments but should be determined by the appended claims including equivalents thereof.

In the above-described embodiments, steps may be selectively performed or some steps or portions thereof may be omitted. Steps need not necessarily be performed in accordance with the described order in all embodiments. The disclosed embodiments are provided to facilitate an understanding of the present invention, not to limit it. That is, it should be apparent to those skilled in the art that various modifications can be made on the basis of the technological scope of the present disclosure.

Although specific terminologies are used herein, they are used only to explain the embodiments of the present disclosure. Therefore, the present disclosure is not restricted to the above-described embodiments, as those skilled in the art will recognize that many variations are possible within the spirit and scope of the present disclosure. The present invention encompasses all modifications and variations of any disclosed embodiment that fall within the scope of the appended claims.

What is claimed is:

1. A memory controller for controlling a plurality of memory devices coupled through a plurality of channels, the memory controller comprising:
    a request checker configured to identify memory devices corresponding to requests received from a host among the plurality of memory devices, and generate device information on the identified memory devices to perform operations corresponding to the requests;
    a dummy manager configured to output a request for controlling a dummy pulse to be applied to channels of selected memory devices according to the device information among the plurality of channels; and
    a dummy pulse generator configured to sequentially apply the dummy pulse to the channels coupled to the selected memory devices based on the request for controlling the dummy pulse.

2. The memory controller of claim 1, wherein the dummy pulse generator applies the dummy pulse by setting at least one of a level of the dummy pulse, a period of the dummy pulse, and a duration of the dummy pulse.

3. The memory controller of claim 1, wherein the dummy manager outputs a dummy pulse generation request for requesting the dummy pulse to be applied to the channels coupled to the selected memory devices before the selected memory devices start operations according to the device information.

4. The memory controller of claim 3, wherein the dummy pulse generator applies the dummy pulse to any one channel among the channels coupled to any one of the selected memory devices according to the device information, based on the dummy pulse generation request, and then applies the dummy pulse to another of the channels after a set first time elapses.

5. The memory controller of claim 1, further comprising:
    an enable signal generator configured to generate chip enable signals for selecting the plurality of memory devices; and
    a command queue group including command queues respectively corresponding to the plurality of memory devices.

6. The memory controller of claim 5, wherein the dummy manager receives chip enable signals respectively corresponding to the selected memory devices according to the device information from the enable signal generator, and determines memory devices to end operations, based on chip enable signals in a high state among the received chip enable signals.

7. The memory controller of claim 6,
    wherein the dummy manager outputs a command queue level request for determining command queue levels of memory devices corresponding to the chip enable signals in the high state,
    wherein the command queue group outputs the command queue levels corresponding to the command queue level request.

8. The memory controller of claim 7, wherein, when the command queue levels of the memory devices corresponding to the chip enable signals in the high state are all 0, the dummy manager determines to apply the dummy pulse to all channels coupled to the memory devices corresponding to the chip enable signals in the high state.

9. The memory controller of claim 8, wherein, when the dummy pulse is applied to all the channels coupled to the memory devices corresponding to the chip enable signals in the high state, the dummy manager determines to interrupt the dummy pulse applied to any one of the channels and interrupt the dummy pulse applied to another of the channels after a set second time elapses.

10. The memory controller of claim 8, wherein, when the command queue levels of the memory devices corresponding to the chip enable signals in the high state are not all 0, the dummy manager determines whether a number of memory devices of which command queue levels are 0 is two or more.

11. The memory controller of claim 10, wherein, when the number of memory devices of which command queue levels are 0 is 1, the dummy manager determines to apply the dummy pulse to channels coupled to memory devices corresponding to the chip enable signals in the high state excluding the memory device of which a command queue level is 0.

12. The memory controller of claim 10, wherein, when the number of memory devices of which command queue levels are 0 is two or more, the dummy manager determines to apply the dummy pulse to all the channels coupled to the memory devices corresponding to the chip enable signals in the high state and then interrupts the dummy pulse applied to channels coupled to the memory devices of which command queue levels are 0 after a set third time elapses.

13. A method for operating a memory controller for controlling a plurality of memory devices coupled through a plurality of channels, the method comprising:
    identifying memory devices corresponding to requests received from a host among the plurality of memory devices;
    generating device information for memory devices to perform operations corresponding to the requests;
    outputting a request for controlling a dummy pulse to be applied to channels of selected memory devices according to the device information among the plurality of channels; and
    sequentially applying the dummy pulse to the channels coupled to the selected memory devices, based on the request for controlling the dummy pulse.

14. The method of claim 13, wherein, the outputting of the request for controlling the dummy pulse includes outputting a dummy pulse generation request such that the dummy pulse is applied to the channels coupled to the selected memory devices before the selected memory devices start operations according to the device information.

15. The method of claim 14, wherein, the sequentially applying of the dummy pulse includes applying the dummy pulse to any one channel among the channels coupled to the selected memory device according to the device information, based on the dummy pulse generation request, and then applying the dummy pulse to another of the channels after a set first time elapses.

16. The method of claim 13, wherein the outputting of the request for controlling the dummy pulse includes determining memory devices to end operations among the plurality of memory devices by checking whether chip enable signals for selecting the plurality of memory devices are in a high state.

17. The method of claim 16, wherein the outputting of the request for controlling the dummy pulse further includes checking command queue levels of the memory devices to end the operations.

18. The method of claim 17, wherein the outputting of the request for controlling the dummy pulse includes outputting a request for applying the dummy pulse to all channels coupled to the memory devices corresponding to the chip enable signals in the high state, when the command queue levels of the memory devices to end the operations are all 0.

19. The method of claim 18, wherein, the sequentially applying of the dummy pulse includes interrupting the dummy pulse applied to any one of the channels, and then interrupting the dummy pulse applied to another of the channels after a set second time elapses, when the dummy pulse is applied to all the channels coupled to the memory devices corresponding to the chip enable signals in the high state.

20. The method of claim 18, wherein, the sequentially applying of the dummy pulse includes determining, when the command queue levels of the memory devices corresponding to the chip enable signals in the high state are not all 0, applying the dummy pulse to the channels coupled to the memory devices of which command queue levels are 0.

* * * * *